United States Patent [19]
Azuma et al.

[11] Patent Number: 5,683,547
[45] Date of Patent: Nov. 4, 1997

[54] PROCESSING METHOD AND APPARATUS USING FOCUSED ENERGY BEAM

[75] Inventors: Junzou Azuma, Yokohama; Fumikazu Itoh, Fujisawa; Satoshi Haraichi; Akira Shimase, both of Yokohama; Junichi Mori, Kodama-gun; Takahiko Takahashi, Iruma; Emiko Uda, Oume, all of Japan

[73] Assignee: Hitachi, Ltd., Tokyo, Japan

[21] Appl. No.: 273,780

[22] Filed: Jul. 12, 1994

Related U.S. Application Data

[63] Continuation of Ser. No. 795,311, Nov. 20, 1991, abandoned.

[30] Foreign Application Priority Data

| Nov. 21, 1990 | [JP] | Japan | 2-314278 |
| Jun. 18, 1991 | [JP] | Japan | 3-146298 |
| Sep. 20, 1991 | [JP] | Japan | 3-241757 |

[51] Int. Cl.$^6$ .................................................. H01L 21/30
[52] U.S. Cl. .................. 156/643.1; 216/37; 216/66; 427/552
[58] Field of Search .................. 216/65, 37, 66; 156/643.1; 219/121.69, 121.15, 121.2; 204/298.04, 298.36, 192.11, 192.34; 427/554–556, 552, 582–584, 586

[56] References Cited

U.S. PATENT DOCUMENTS

| 4,380,488 | 4/1983 | Reichelderfer et al. | 156/646 |
| 4,503,329 | 3/1985 | Yamaguchi et al. | 250/309 |
| 4,529,475 | 7/1985 | Okano et al. | 156/643 |
| 4,609,809 | 9/1986 | Yamaguchi et al. | 219/121.35 |
| 4,617,087 | 10/1986 | Iyer et al. | 156/646 |
| 4,698,236 | 10/1987 | Kellogg et al. | 427/582 |
| 4,851,097 | 7/1989 | Hattori et al. | 216/66 |
| 4,868,068 | 9/1989 | Yamaguchi et al. | 428/596 |
| 4,874,460 | 10/1989 | Nakagawa et al. | 204/298.33 |
| 4,889,609 | 12/1989 | Cannella | 204/298.33 |
| 4,930,439 | 6/1990 | Sato et al. | 118/723 |
| 4,959,245 | 9/1990 | Dobson et al. | 427/53.1 |
| 4,994,140 | 2/1991 | Kenzo et al. | 156/643.1 |
| 5,055,696 | 10/1991 | Hariachi et al. | 250/492.2 |
| 5,298,112 | 3/1994 | Hayasaka et al. | 216/67 |

FOREIGN PATENT DOCUMENTS

| 59-107934 | 6/1984 | Japan . |
| 59-151427 | 8/1984 | Japan . |
| 0260131 | 12/1985 | Japan . |
| 61-123841 | 6/1986 | Japan . |
| 0057220 | 3/1987 | Japan . |
| 0005531 | 1/1988 | Japan . |
| 635531 | 1/1988 | Japan . |
| 1-42822 | 2/1989 | Japan . |
| 1-129256 | 5/1989 | Japan . |
| 0189912 | 7/1989 | Japan . |
| 1-169858 | 7/1989 | Japan . |
| 1-169860 | 7/1989 | Japan . |
| 4-350931 | 12/1992 | Japan . |

OTHER PUBLICATIONS

Christian R. Musil, et al., "Focused Ion Beam Microsurgery for Electronics", IEEE Electron Device Letters, vol. EDL–7, No. 5, May 1986, pp. 285–287.

*Primary Examiner*—Robert Kunemund
*Assistant Examiner*—Anita Alanko
*Attorney, Agent, or Firm*—Fay, Sharpe, Beall, Fagan, Minnich & McKee

[57] ABSTRACT

A processing method and apparatus using a focused energy beam for conducting local energy beam processing in a focused energy beam irradiating area by irradiating a sample with a focused energy beam such as an ion beam or an electron beam in an etching gas atmosphere. As the etching gas, a mixed gas different in composition from any conventional one is employed and the gas is uniformly supplied to an etching area and at least one of the components of such a mixed gas is a spontaneous reactive gas for use in etching the sample spontaneously and isotropically. With this arrangement, it is possible to subject to local etching a material for which the local etching has been impossible to provide since a single etching gas causes a reaction too fierce or causes almost nearly no reaction.

5 Claims, 29 Drawing Sheets

FIG. 25a₁ 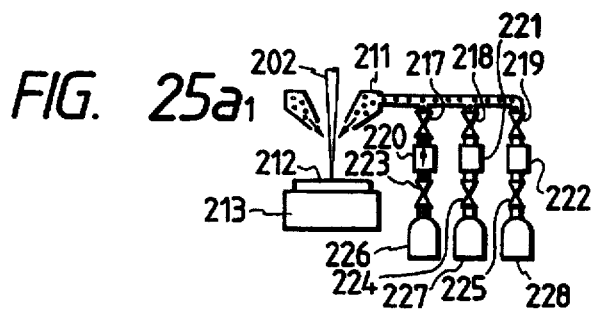 FIG. 25a₂ 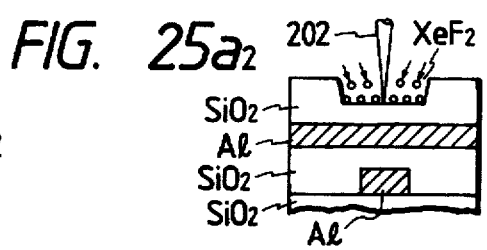
FIG. 25b₁ 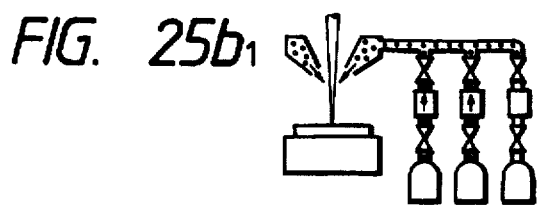 FIG. 25b₂ 
FIG. 25c₁ 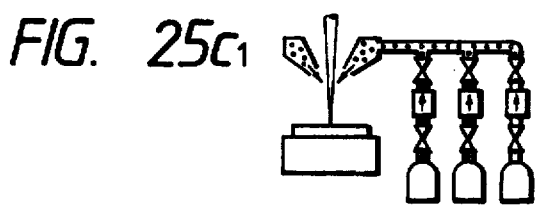 FIG. 25c₂ 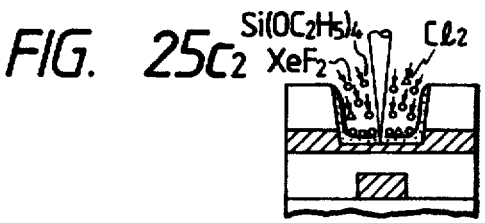
FIG. 25d₁ 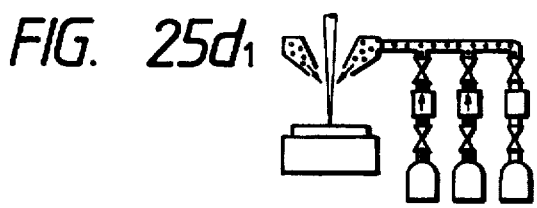 FIG. 25d₂ 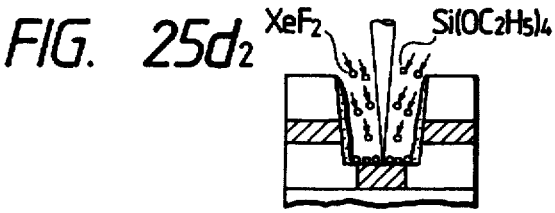
FIG. 25e₁ 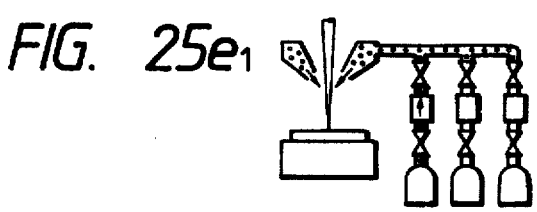 FIG. 25e₂ 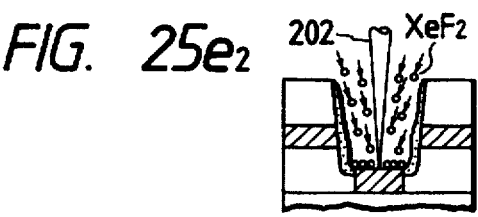

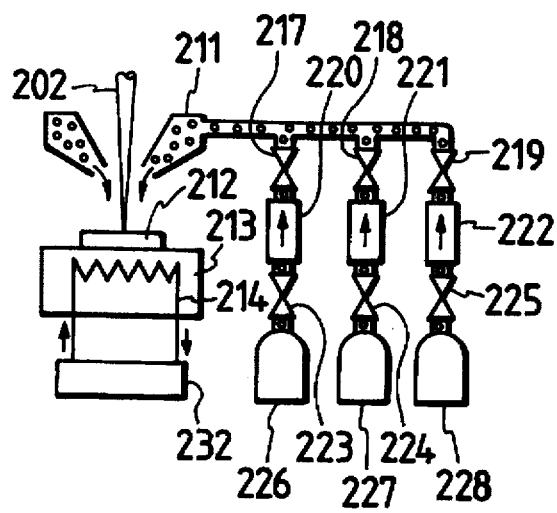
FIG. 28a₁
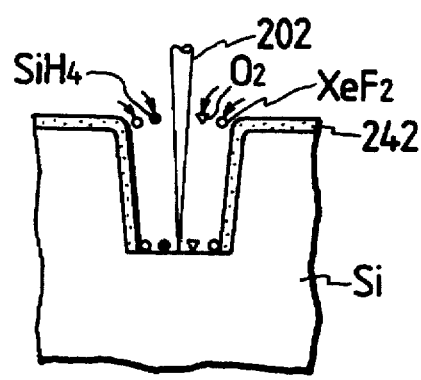
FIG. 28a₂
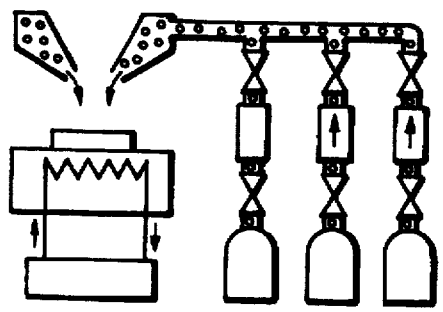
FIG. 28b₁
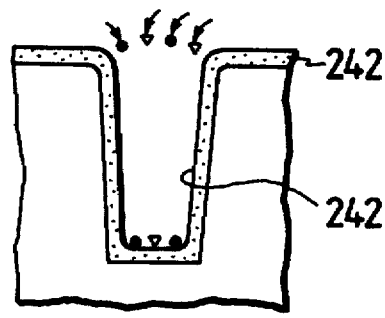
FIG. 28b₂

FIG. 31a₁
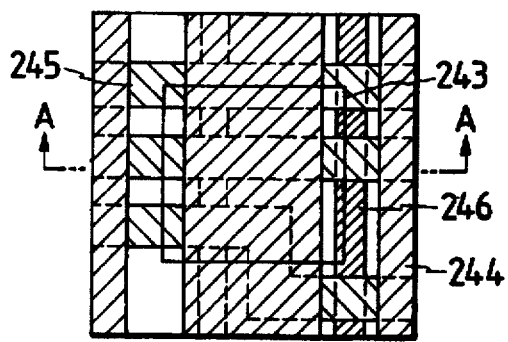
FIG. 31a₂ (PRIOR ART)
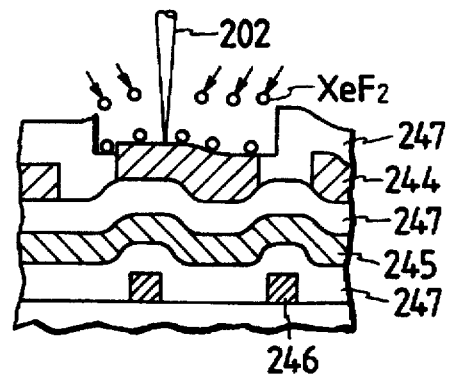
FIG. 31b₁
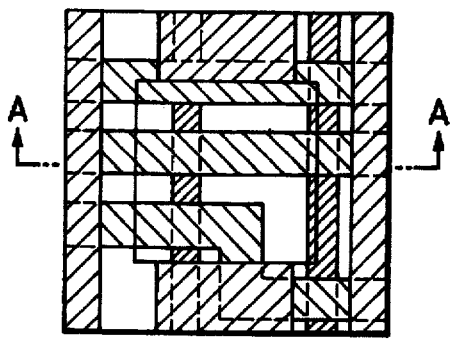
FIG. 31b₂ (PRIOR ART)
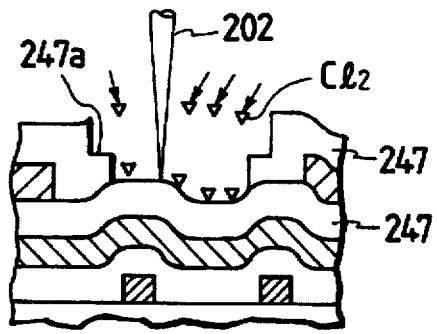
FIG. 31c₁
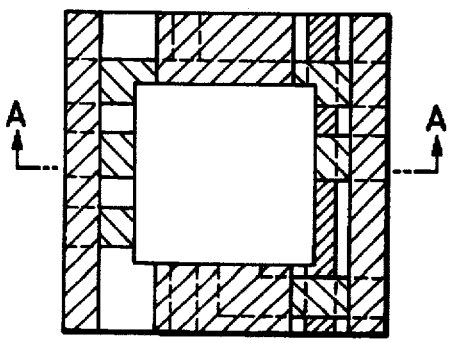
FIG. 31c₂ (PRIOR ART)
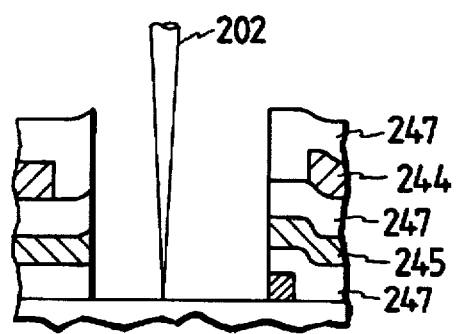

FIG. 32a₁
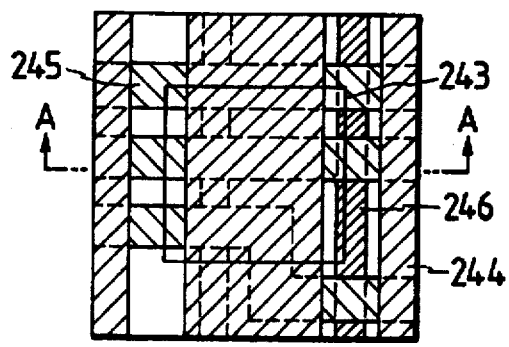
FIG. 32a₂
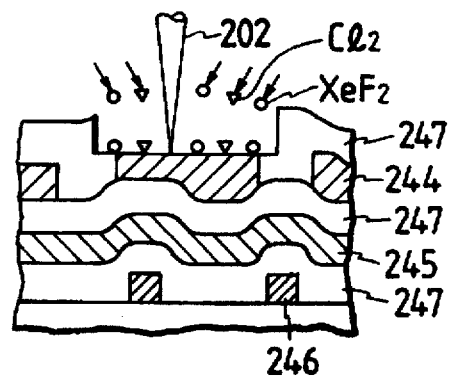
FIG. 32b₁
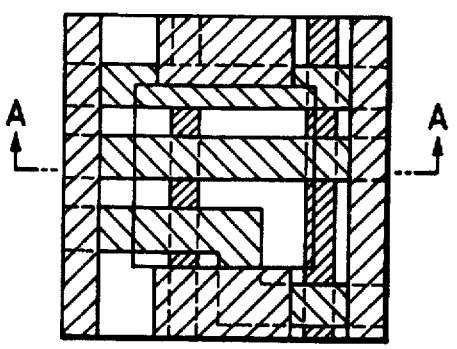
FIG. 32b₂
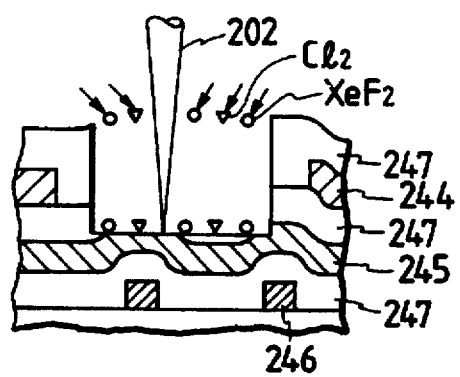
FIG. 32c₁
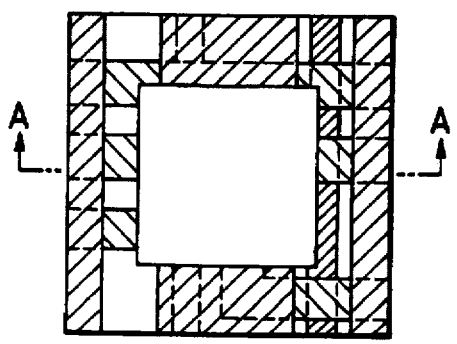
FIG. 32c₂
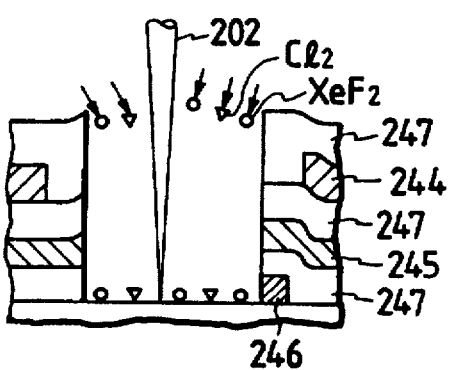

FIG. 40a₁
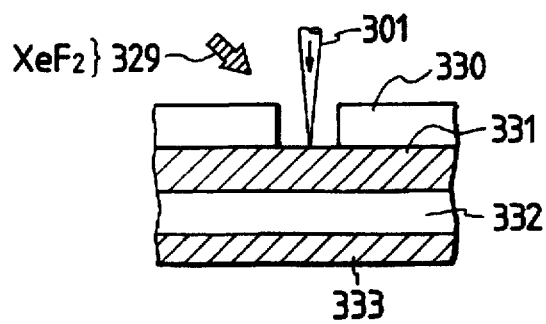
FIG. 40a₂
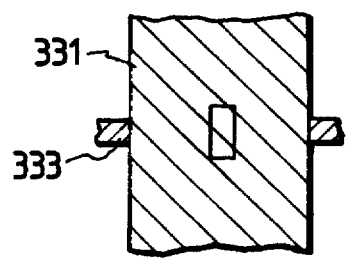
FIG. 40b₁
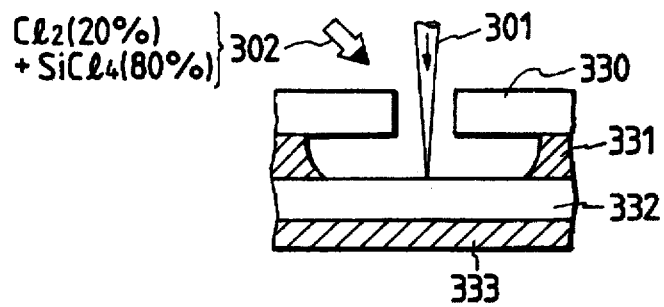
FIG. 40b₂
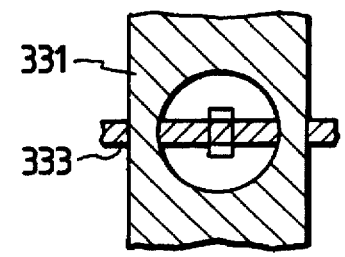
FIG. 40c₁
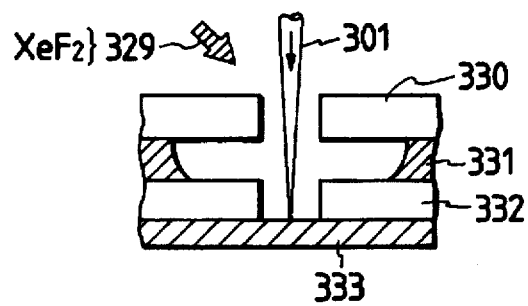
FIG. 40c₂
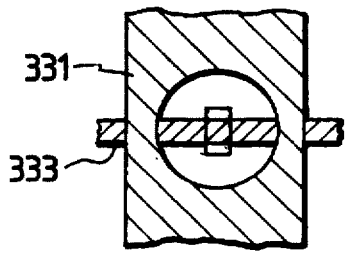
FIG. 40d₁
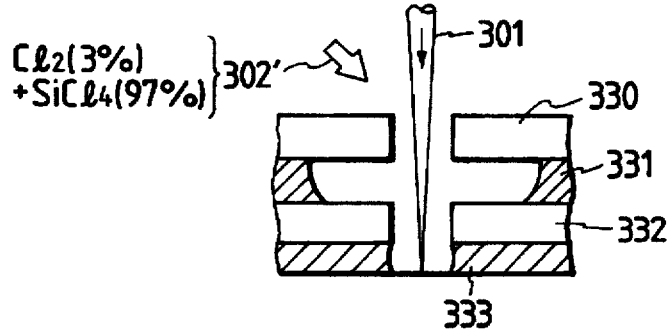
FIG. 40d₂
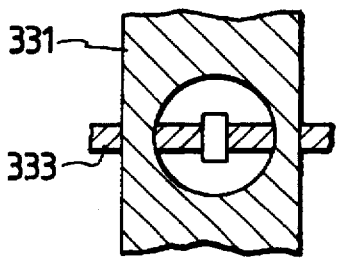

FIG. 42a₁
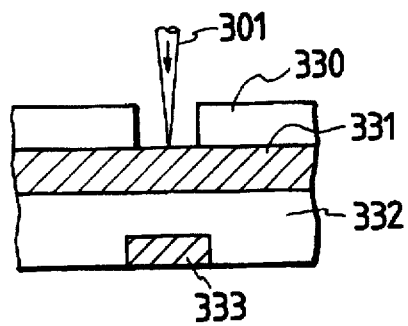
FIG. 42a₂
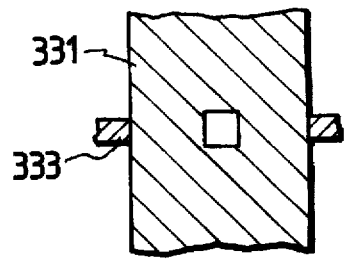
FIG. 42b₁
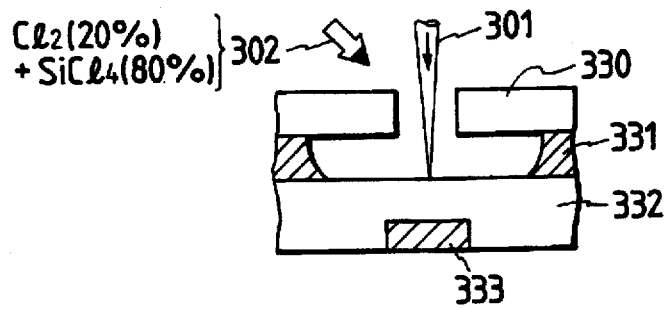
FIG. 42b₂
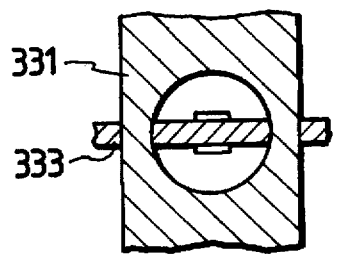
FIG. 42c₁
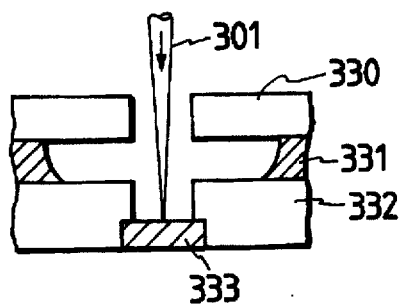
FIG. 42c₂
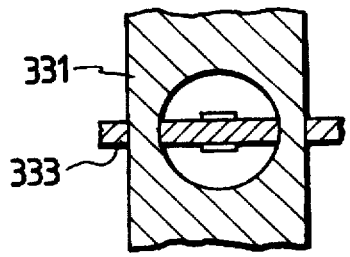
FIG. 42d₁
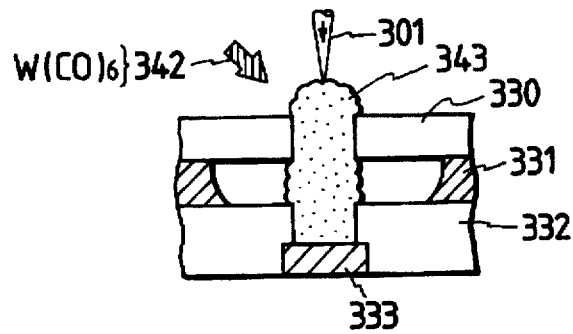
FIG. 42d₂
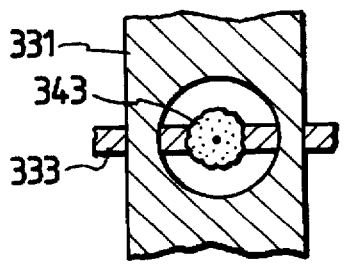

PROCESSING METHOD AND APPARATUS USING FOCUSED ENERGY BEAM

This is a continuation of U.S. application Ser. No. 07/795,311, filed Nov. 20, 1991, now abandoned.

BACKGROUND OF THE INVENTION

The present invention relates generally to processing apparatus such as a charged particle beam processing apparatus using a focused energy beam such as a charged particle beam together with a reactant gas for applying microsurgery to samples and to processing methods therefor. More particularly, the present invention relates to a processing method and apparatus using a focused energy beam for uniformly supplying a reactant gas to an etching area on a sample, observing a high contrast secondary particle microscope image and the like.

Further, the present invention relates to a local etching and a local CVD method and more particularly to a method for conducting local etching by irradiating a sample with an energy beam in an etching gas atmosphere to induce a chemical reaction in an irradiating area and an apparatus for implementing the method.

Charged particle beams such as focused ion beams and electron beams are generally capable of being finely focused and the energy of the charged particle beam may be used for microsurgery including modification of wiring in semiconductor devices such as LSIs, fail analysis and the like. However, as microsurgery using a charged particle beam is sputter processing for releasing sample atoms by means of the charged particle beam, it still poses some problems, including low processing speed, a narrow selection range of materials of samples as workpieces and difficulty in refraining from etching at a desired layer when layers different in material have been laminated.

On the other hand, studies are being increasingly made recently in the field of etching technology using reactant gases together with charged particle beams such as focused ion beams and electron beams. With this technology, a reactant gas is activated by the energy derived from the charged particle beam and as a chemical reaction is induced, a sample is etched at high speed. Moreover, the etching operation can be stopped at a desired layer of material by selecting the most suitable reactant gas for the material of the sample (a gas highly reactive to the material of the sample). Further, the use of a CVD gas as the reactant gas makes local CVD possible.

Japanese Patents Laid-Open Nos. 42822/1989 and 169860/1989 also disclose processing apparatus of the sort related to the foregoing.

Moreover, 'Focused Ion Beam Microsurgery for Electronics,' IEEE ELECTRON DEVICE LETTERS, VOL. EDL-7, NO. 5 May (1986) may be referred to as an ion beam microsurgery relating to the ion beam etching method of this sort.

As examples in which reactant type etching is locally employed in an irradiating area of a charged particle beam such as a focused ion beam and an electron beam, there are a method of blowing a reactant gas from one nozzle onto a workpiece diagonally from above as a reactant gas supply method; and another method of covering a workpiece with a sub-chamber and filling the sub-chamber with a reactant gas. The former was described in Japanese Patent Laid-Open No. 169858/1989, whereas the latter was discussed in 'Journal of Vacuum Science and Technology, B5(1), pp 423–426, Jan/Feb. 1987.'

In the sub-chamber method, however, no attempt has been made to install a movable stage for mounting the workpiece in the sub-chamber in order to make the etching position movable and the problem is that etching is considered possible only within beam deflection.

As a reactant gas is unidirectionally supplied to the surface of a sample by means of a gas pipe in the prior art, there arises a difference in reactant gas supply between sectors with and without a gas nozzle when it is attempted to form a hole having a high aspect ratio, for instance, and this results in a disparity in etching geometry proportional to the amount of the reactant gas thus supplied. Consequently, a hole having an adequate aspect ratio has not been formed.

The reactant gas has to be uniformly supplied to an etching area to prevent such a disparity in etching geometry. Japanese Patent Laid-Open No. 151427/1984, for instance, discloses an apparatus of that sort, which is designed to supply a reactant gas uniformly by providing another coaxial passage around either an ion beam or a reactant gas passage. No secondary particle detector for observing the surface of a sample to determine an etching position has been considered in the prior art and as processing speed relies on an amount of reactant gas to be supplied, the distance between a reactant gas nozzle and the sample has to be narrowed. Consequently, the secondary particles produced by irradiating the sample with ion beams are not satisfactorily detected by the secondary particle detector but buried in other noises. The problem is that an image on the surface of the sample is unlikely to be observed satisfactorily.

As it is possible to focus ion beams and electron beams to 0.1 μm or less, the energy is usable for microsurgery and local CVD. Studies are being promoted recently to make apparatus for correcting photomasks and LSI wiring using focused energy beams fit for practical use.

Reactant type etching is locally induced in a beam irradiating area by supplying an etching gas to the surface of a sample simultaneously with the irradiation of the focused energy beam. High speed, selective microsurgery has been known to be thus attainable through these steps. Japanese Patent Laid-Open No. 129256/1989, for instance, may be given as an example which refers to an apparatus of this sort.

In the energy beam local etching apparatus cited as a conventional example, one single kind of etching gas is normally used as the etching gas stated above. However, there are still some kinds of etching gases which advance a reaction spontaneously and isotropically against the material of a workpiece and are unable to avoid side-etching. Even if an etching gas for use in a high energy plasmic stake during normal dry etching is employed for the energy beam local etching, an effective reaction may often be withheld because the energy given by the energy beam is insufficient as the etching gas itself is in a molecular state and consequently has low energy. In other words, the use of such a single etching gas renders the reaction too fierce or otherwise almost ineffective, thus making hopeless precision high-velocity etching.

When Al is processed, for instance, a spontaneous reaction with $Cl_2$ employed as an etching gas becomes turbulent and produces intense side-etching, whereas when $SiCl_4$ or $BCl_3$ is used as an etching gas, almost no local reaction arises. There is no single etching gas which is found exhibiting an appropriate reaction.

SUMMARY OF THE INVENTION

An object of the present invention is to arrange for a reactant gas to be uniformly supplied to an etching area on a sample and for a high contrast secondary particle microscope image of a charged particle beam to be made observable. The object can be accomplished by coaxially installing a plurality of gas nozzles that are axially symmetrically formed (e.g., in a discoidal form) and a microchannel plate as a secondary particle detector, providing a passage for the charged particle beam such as an energy beam in the central parts of both members, providing the gas nozzle with a hollow room for the reactant gas, coupling the hollow room to a gas supply pipe via a gas passage, circumferentially fitting a plurality of gas blowing pipes to the gas nozzle at equal intervals, communicating the entrance side end of each gas blowing pipe with the hollow room via a gas passage, and disposing the exit side end thereof in such a way that the reactant gas may be blown onto the etching area of the sample. With respect to the use of the reactant gas according to the present invention, a mixed gas comprising an etching gas, which causes a spontaneous reaction resulting from its extremely fierce reaction, and another less reactive is employed for conducting energy beam local etching and by controlling a mixture ratio of the mixed gas so as to set the ratio at a given value, high-speed precise etching is made feasible.

In addition, a mixed gas comprising an etching gas, which causes an extremely fierce and a spontaneous reaction, and a CVD gas is used for conducting the energy beam local etching while a mixture ratio of the mixed gas is so controlled as to set the ratio at a given value.

BRIEF DESCRIPTION OF THE DRAWINGS

FIGS. 28$a_1$–28$b_2$ are diagrams illustrating the formation of an element separation groove embodying the present invention.

FIGS. 31$a_1$–31$c_2$ are diagrams illustrating a conventional sectional microsurgery for a semiconductor element.

FIGS. 32$a_1$–32$c_2$ are diagrams illustrating a sectional microsurgery for semiconductor element according to the present invention.

FIGS. 40$a_1$–40$d_2$ are diagrams illustrating a processing method in the embodiment of FIG. 39 by way of example.

FIGS. 42a1–42a2 is a diagram illustrating a processing method in the embodiment of FIG. 41 by way of example.

DESCRIPTION OF THE PREFERRED EMBODIMENT

A description will subsequently be given of a case where charged particles or ion beams are employed as a specific embodiment using focused energy beams of the present invention before each embodiment thereof is explained.

A charged particle beam processing apparatus of the present invention comprises a means for supplying a reactant gas to an etching area symmetrically about an ion beam irradiating axis, a stage of XYZ three-axis construction for use in mounting a workpiece and a means for detecting the height of a table on the stage. The processing apparatus otherwise comprises a sub-chamber for covering an etching area, a means for supplying a reactant gas to the sub-chamber, a stage for moving a workpiece in the sub-chamber and a means for detecting pressure in the sub-chamber.

Figure 7:
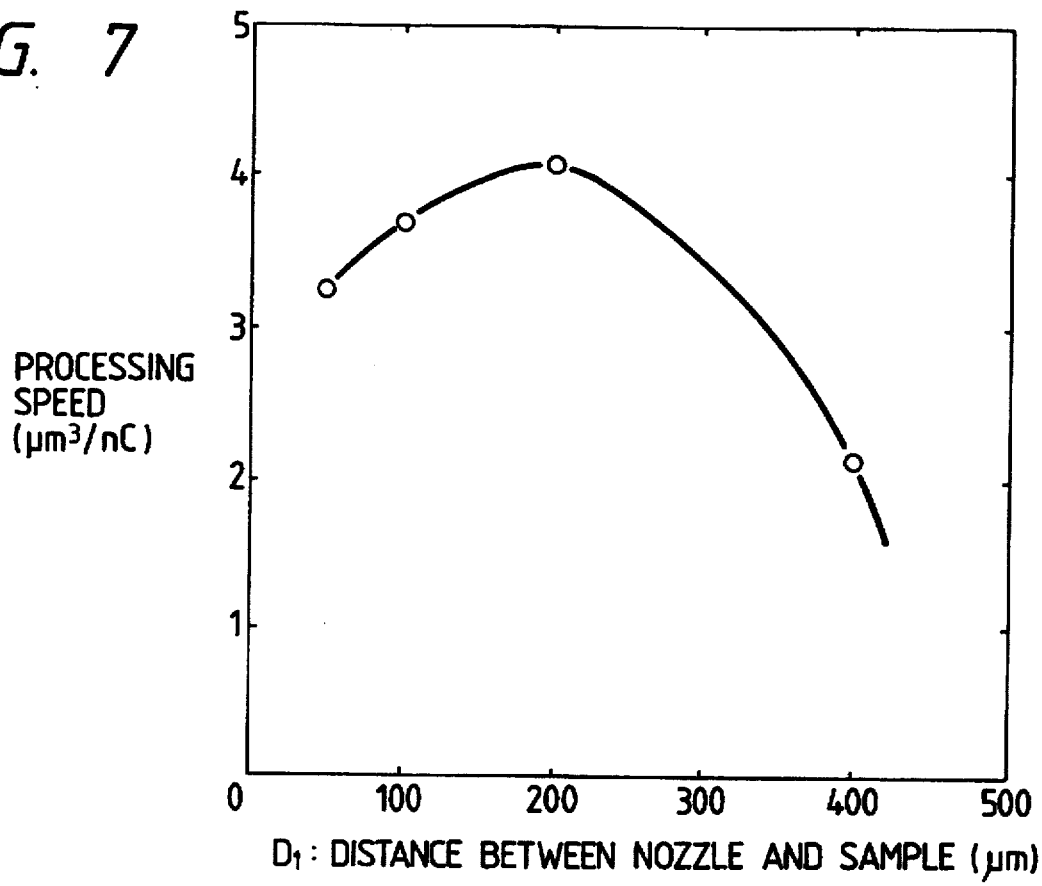
FIG. 7 is a graph showing test results of the distance between a nozzle and a sample, and acceleration.
Figure 8:
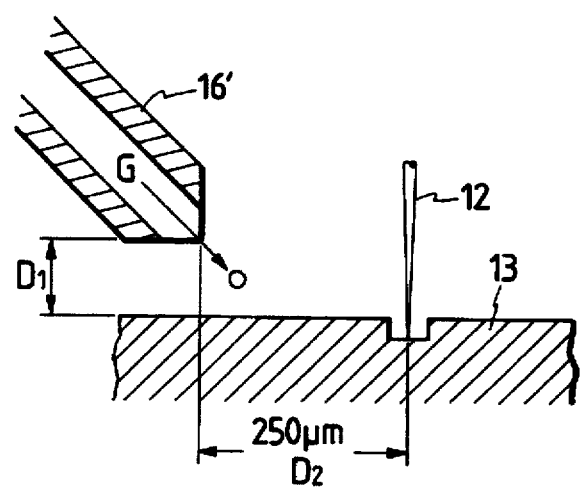
FIG. 8 is a diagram showing test conditions with reference to FIG. 7.

When an LSI chip is actually modified, opening windows and cutting are conducted for wiring at scores of places over a wide area. Consequently, it is essential to use an XY stage for moving an etching position. If a reactant gas is blown from one nozzle to an etching area diagonally from above, the etching configuration may be biased because of the directional supply of the gas to the etching area. Moreover, the test results showed that acceleration varied with the distance between the nozzle and a sample even though the flow rate of the gas was kept constant. FIG. 7 shows the test results (those shown in FIG. 7 were based on the conditions displayed in FIG. 8). According to the test results, the distance $D_i$ in value between the nozzle and the sample shown in FIGS. 7, 8 varies with the etching position as the XY stage deflects and tilts when the etching position is moved by the stage simply with the fixed nozzle, thus causing the processing speed to fluctuate. Therefore, a desired processing result is hardly obtainable. Incidentally, $D_2$ in FIG. 8 denotes the horizontal distance between the nozzle and the beam.

The gas distribution on the etching area is thus uniformized by supplying the reactant gas symmetrically about the ion beam irradiating axis to the etching area and uniform etching with a configuration free from bias may be implemented. Provided the gas is supplied on the same condition by interlocking the movement of the workpiece with that of the stage and detecting the height of the stage and the flow rate of the reactant gas, irrespective of the etching position, the etching may be conducted always at the same speed as the gas concentration is made constant on the etching area.

When the sub-chamber is used to supply the gas, moreover, the lower part of the sub-chamber is closed on the surface of the table that has mounted the workpiece so that a stage drive may drive the stage without being exposed to a reactant gas atmosphere. By conducting the etching on the same gas condition while detecting the gas pressure in the sub-chamber, the etching is uniformized.

Referring to the accompanying drawings, an embodiment of the present invention will subsequently be described.

Figure 1:
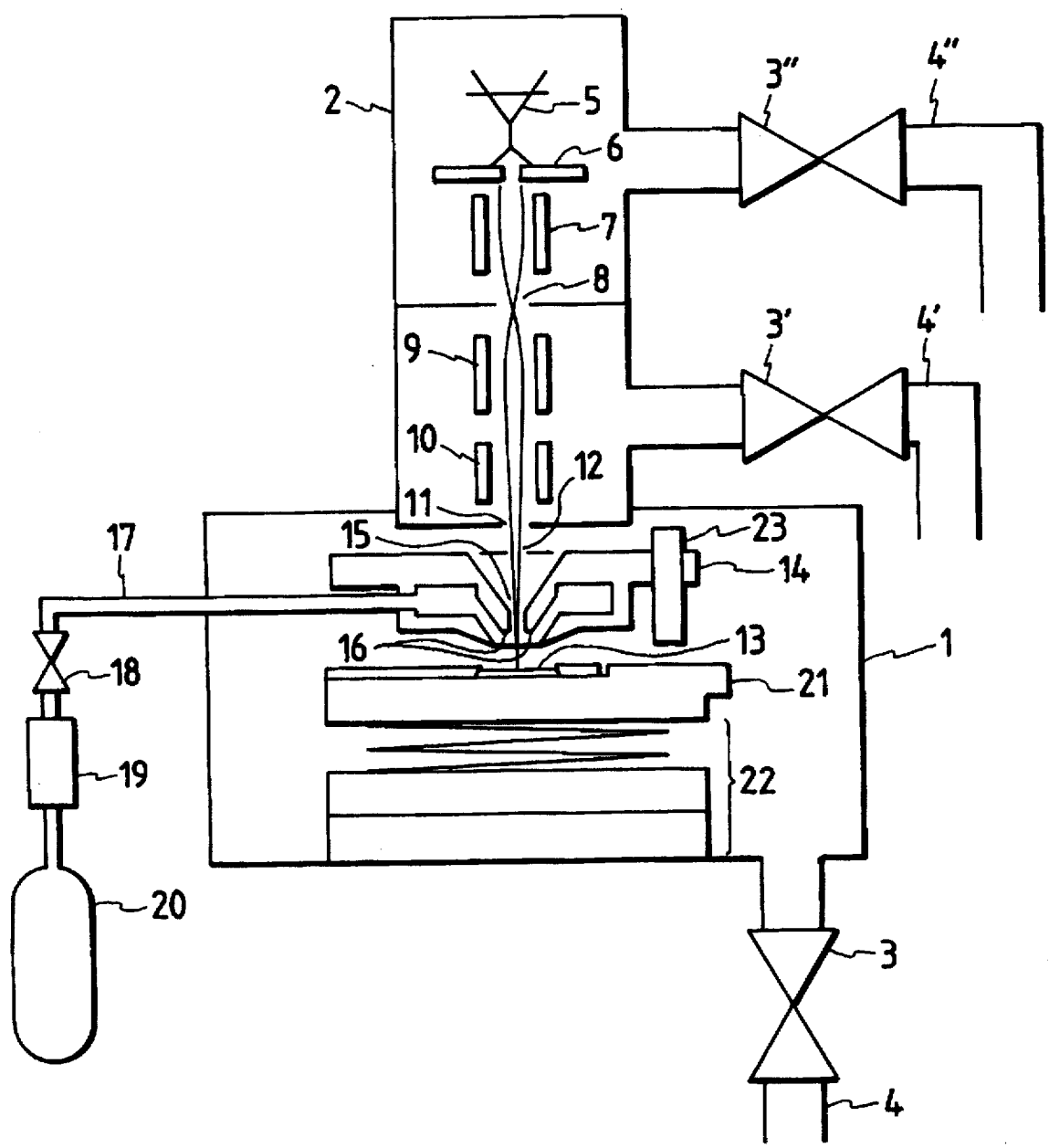
FIG. 1 is a block diagram illustrating the overall construction of an apparatus embodying the present invention.

FIG. 1 is a block diagram illustrating the overall construction of an apparatus embodying the present invention.

Focused ion beams are employed as charged particle beams in this embodiment and electron beams are also usable.

In an IB (ion beam) chamber 2 is a focused ion beam optical system comprising a lead-in electrode 6 for leading ion beams 12 from an ion source 5, a pre-stage focusing lens 7 for focusing the ion beams 12 thus led out, an aperture 8, a post-stage focusing lens 9 and a deflecting electrode 10 for deflecting the ion beams 12, the optical system being controlled by an ion beam controller (not shown). In addition, an orifice 11 for letting pass the ion beam 12 is provided in the bottom of the IB chamber 2.

A main chamber 1 accommodates a table 21 for mounting a sample 13, a stage 22 of XYZ three-axis construction, a nozzle 14 for blowing a reactant gas onto the sample, and a reactant gas cylinder 20 connected via a gas supply pipe 17, a valve 18 and a mass flow controller 19. In addition, the IB chamber 2 and the main chamber 1 are exhausted by a vacuum pump through exhaust tubes 4, 4', 4" and valves 3, 3", 3".

The nozzle 14 has a through-hole 15 through which the ion beam 12 passes and several jets 16 from which the reactant gas is blown out toward the sample 13 in an etching area, the jets centering on the hole 15 coaxially. With this arrangement, the reactant gas is uniformly blown from the whole circumference from above to the sample 13 and the horizontal directivity of the gas supplied from the nozzle is offset. The gas distribution in the etching area is thus uniformized.

The nozzle 14 is provided with electrostatic sensors 23, 23', 23", whereas the table 21 for mounting the sample 13 on the stage side is pushed out up to a position opposite to the electrostatic sensors 23, 23', 23". With the use of sensors (displacement meters) whose output voltage linearly changes with the electrostatic capacity in this case, the '0' point distance between the nozzle 14 and the sample 13 is corrected. With the use of sensors (switches) whose output voltage sharply changes at a predetermined electrostatic capacity therein, on the other hand, the output displacement of the sensor is so adjusted that it arises when the distance between the nozzle 14 and the sample 13 is attained as desired.

A description will subsequently be given of a method of controlling the distance between the sample 13 and the nozzle 14 in this embodiment.

First, an adjusting mechanism is provided for the stage 22, for instance. Then X-, Y-axis and the surface of the sample 13 are set parallel to one another and a desired etching area on the sample 13 is placed right under the ion beam irradiating part by moving the stage 22 in the directions of X and Y. After the stage 22 is moved in the directions of X and Y as desired, the table 21 is elevated so that the sample 13 may be set close to the nozzle 14. The electrostatic sensors 23, 23', 23" are used to detect the height of the table 21 at this time and the data thus obtained is fed back to a Z stage controller (not shown) in order for the distance between the sample 13 and the nozzle 14 to be set at a desired value under control. After these steps have been taken, the valve 18 is opened and the reactant gas with the flow rate controlled by the mass flow controller 19 is blown onto the sample 13, which is simultaneously irradiated with the ion beam 12. Etching is thus started. The stage 22 is moved in the directions of X and Y to the next etching position and this operation is repeated in the following.

Figure 2A:
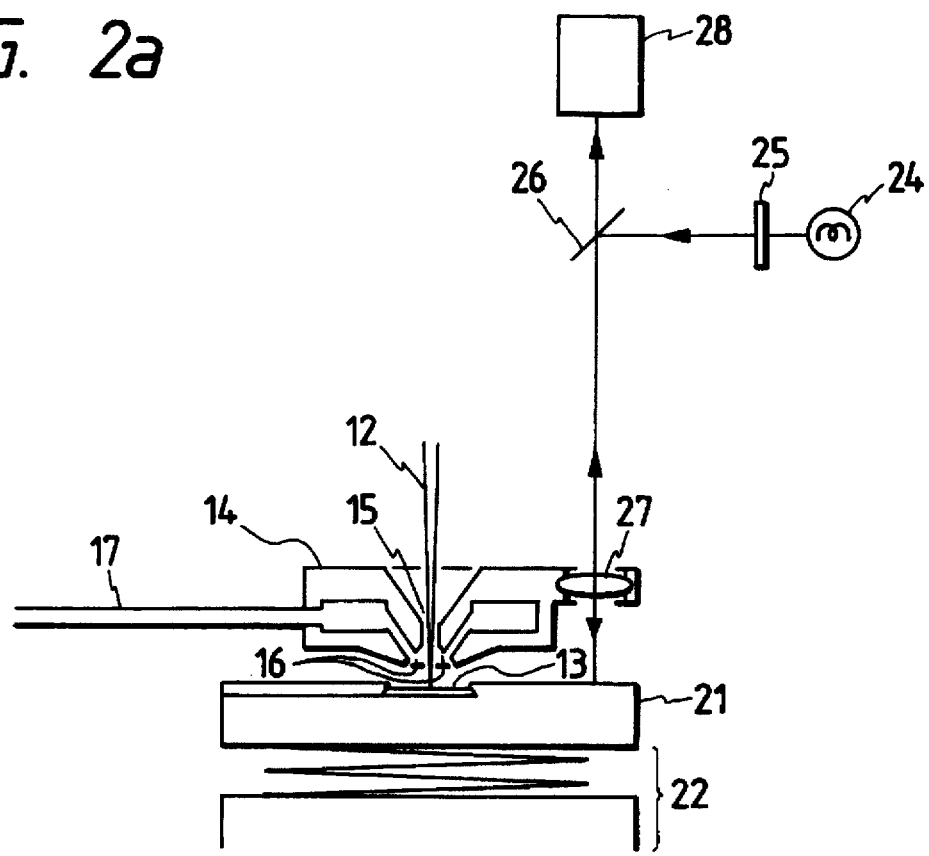
FIGS. 2a, 2b are diagrams illustrating another detecting method in the embodiment of FIG. 1.
Figure 2B:
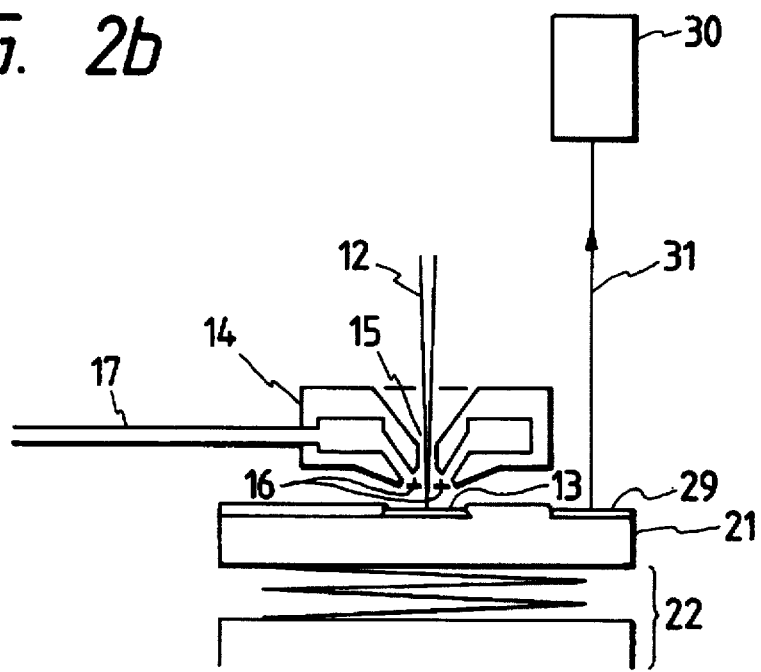

FIGS. 2a, 2b show another detecting method for controlling the height described above.

FIG. 2a refers to a case where an autofocus system using light is employed. In this case, a projector 24 is used to project a striped pattern on a mask 25 via an objective lens 27 and an autofocus sensor (CCD) 28 is used to detect the way the image is being formed. The distance between the sample 13 and the nozzle 14 is thus precisely controlled.

FIG. 2b refers to a case where the distance between the sample 13 and the nozzle 14 is precisely controlled by means of a laser length measuring instrument 30 so as to irradiate a mirror 29 on the table 21 with a laser beam for measuring the height of the table 21.

In either of the detecting methods described above, the distance between the nozzle 14 and the sample 13 is rendered constant only by moving the stage 22 in the directions of X and Y to a second and a further etching position with the Z-axis height controlled at the time the initial etching is conducted by setting X-, Y-axis and the surface of the sample 13 parallel to one another.

As demonstrated in this embodiment, the reactant gas is uniformly supplied from the nozzle to the etching area and the flow rate of the reactant gas as well as the distance between the etching area and the nozzle is precisely controlled, whereby the gas concentration in the etching area is set constant. Uniform etching with excellent reproducibility may be made possible even though the etching area is relocated over a wide range.

Figure 3A:
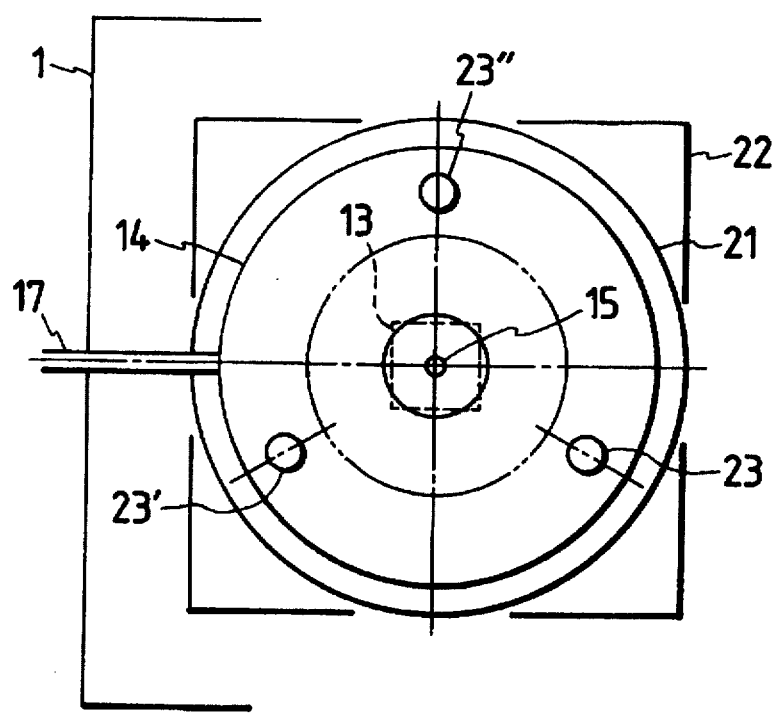
FIGS. 3a, 3b are block diagrams illustrating another apparatus embodying the present invention.
Figure 3B:
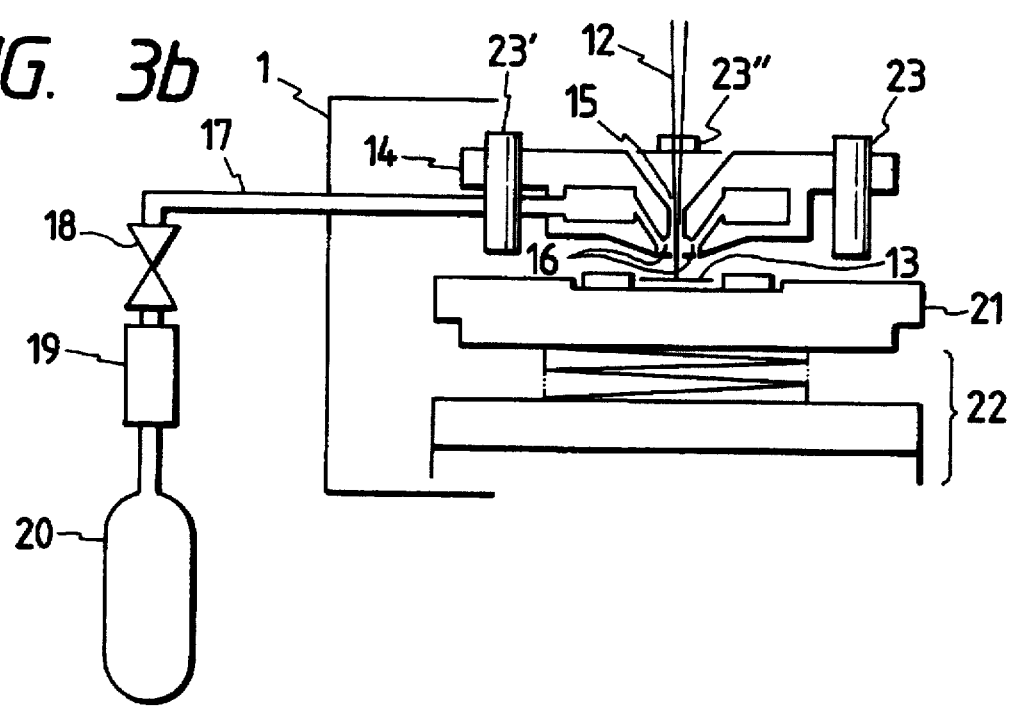

FIGS. 3a, 3b illustrate another embodiment of the present invention, which is effective when it is difficult to set X-, Y-axis and the surface of the sample parallel to one another.

The nozzle shown in the embodiment of FIG. 1 has the coaxial electrostatic sensors 23, 23', 23" at three respective places around the center thereof. The electrostatic sensor for use in this case is the one whose output voltage linearly changes with the electrostatic capacity (displacement meter). The embodiment illustrated in FIGS. 3a, 3b is otherwise similar in constitution and function to what is illustrated in FIG. 1.

A method of controlling the distance between the sample 13 and the nozzle 14 in this embodiment will be described.

First, the tip of the nozzle 14 and each of the detecting faces of electrostatic sensors 23, 23', 23" are arranged so that they are positioned on the same plane. The stage 22 is moved in the directions of X and Y in such a way that a desired etching area on the sample 13 is located right under the ion beam irradiating area 12. The table 21 is then elevated to set the sample 13 close to the nozzle 14 after the movement of the stage 22 in the directions of X and Y is completed. At this time, the electrostatic sensors 23, 23', 23" at the three respective places are used to detect the height of the table 21 relative to the nozzle 14 and the inclination thereof. The data thus obtained is fed back to the Z stage controller (not shown) in order for the distance between the sample 13 and the nozzle 14 to be set at a desired value under control. After these steps have been taken, the valve 18 is opened and the reactant gas with the flow rate controlled by the mass flow controller 19 is blown onto the sample 13, which is simultaneously irradiated with the ion beam 12. Etching is thus started. When the stage 22 is moved in the directions of X and Y to the next etching position, the electrostatic sensors 23, 23', 23" at the three places are used to detect the height and a change of inclination of the table 21. The data thus obtained is fed back to the Z stage controller (not shown). When the stage 22 stops at the next etching position, control is again exerted to keep the same distance between the nozzle 14 and the sample 13. This operation under control is repeated in the followings An autofocus system or a laser length measuring instrument instead of the electrostatic sensor may be used to detect the height of the table 21 likewise.

As demonstrated in this embodiment, the reactant gas is uniformly supplied from the nozzle to the etching area and the flow rate of the reactant gas as well as the distance between the etching area and the nozzle is precisely controlled, whereby the gas concentration in the etching area is set constant. Uniform etching with excellent reproducibility may be made possible even though the etching area is relocated over a wide range.

Figure 4A:
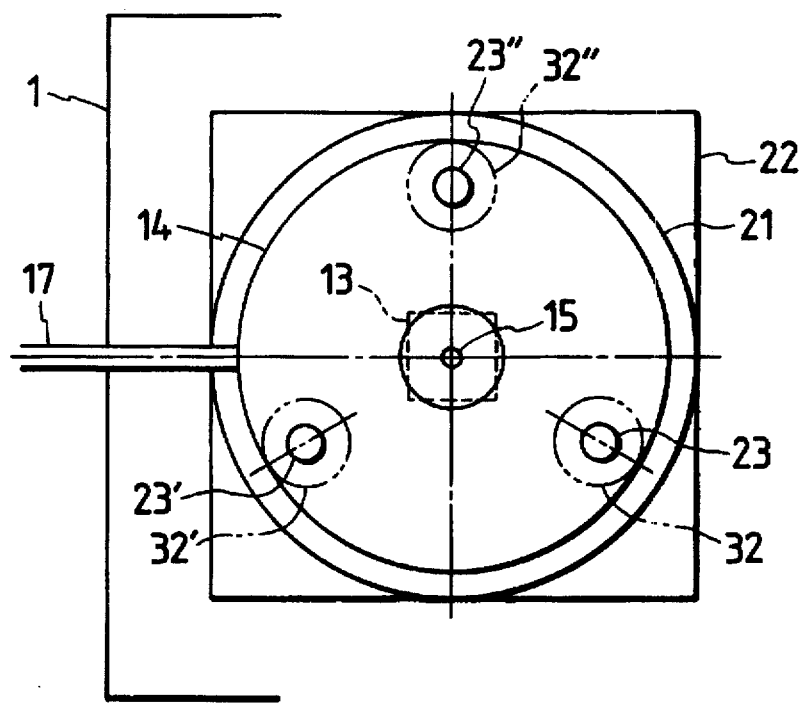
FIGS. 4a, 4b are block diagrams illustrating still another apparatus embodying the present invention.
Figure 4B:
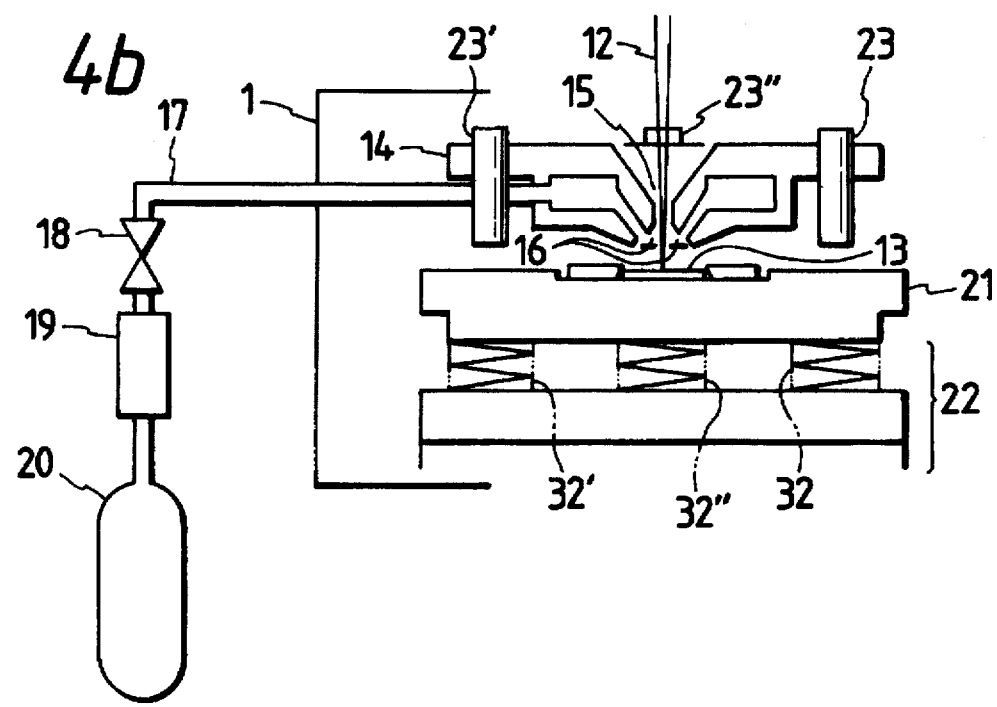

FIGS. 4a, 4b illustrate still another embodiment of the present invention.

The nozzle 14 shown in the embodiment of FIG. 1 has the coaxial electrostatic sensors 23, 23', 23" at three respective places around the center thereof. The electrostatic sensor for use in this case may be either the sensor (displacement meter) shown in the embodiment of FIG. 3a or a sensor (switch) whose output voltage sharply changes at a predetermined electrostatic capacity. Moreover, Z-axis on the side of the Stage 22 is arranged with three-points tilt mechanisms 32, 32', 32" for performing vertical operations corresponding in position to the electrostatic sensors 23, 23', 23". Piezo-tilt mechanisms, for instance, are employed. This third embodiment is otherwise similar in constitution and function to what is illustrated in FIG. 1.

A method of controlling the distance between the sample 13 and the nozzle 14 in this embodiment will be described.

First, the tip of the nozzle 14 and each of the detecting faces of electrostatic sensors 23, 23', 23" are arranged so that they are positioned on the same plane. The stage 22 is moved in the directions of X and Y in such a way that a desired etching area on the sample 13 is located right under the ion beam irradiating area 12. The table 21 is then elevated by the tilt mechanisms 32, 32', 32" after the movement of the stage 22 in the directions of X and Y is completed. At this time, the electrostatic sensors 23, 23', 23" at the three respective places are used to detect the height of the table 21 relative to the nozzle 14 and the inclination thereof. The data thus obtained is fed back to the tilt mechanisms 32, 32', 32" in order for the distance between the sample 13 and the nozzle 14 to be set at a desired value under control. After these steps have been taken, the valve 18 is opened and the reactant gas with the flow rate controlled by the mass flow controller 19 is blown onto the sample 13, which is simultaneously irradiated with the ion beam 12. Etching is thus started. When the stage 22 is moved in the directions of X and Y to the next etching position, the electrostatic sensors 23, 23', 23" at the three respective places are used to detect the height and a change of inclination of the table 21. The data thus obtained is fed back to the Z stage controller to keep the distance between the nozzle 14 and the sample 13 equal and parallel under control. This operation under control is repeated in the following. An autofocus system or a laser length measuring instrument instead of the electrostatic sensor may be used to detect the height of the table 21 likewise.

As demonstrated in this embodiment, the reactant gas is uniformly supplied from the nozzle to the etching area and the flow rate of the reactant gas as well as the distance between the etching area and the nozzle is precisely controlled, whereby the gas concentration in the etching area becomes constant. Uniform etching with excellent reproducibility may be made possible even though the etching area is relocated over a wide range.

Figure 5:
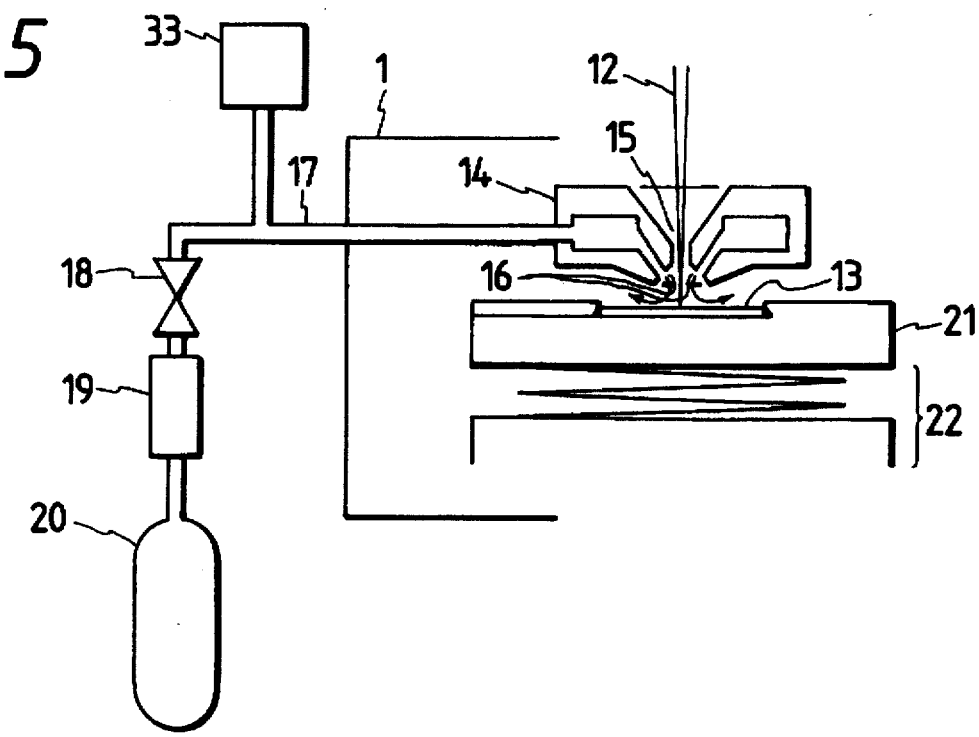
FIG. 5 is a block diagram illustrating still another apparatus embodying the present invention.

FIG. 5 illustrates still another embodiment of the present invention.

The gas supply pipe 17 connected to the nozzle 14 shown in the embodiment of FIG. 1 is provided with a pressure sensor 33 such as a manometer. The embodiment illustrated in FIG. 5 is otherwise similar in constitution and function to what is illustrated in FIG. 1.

The stage 22 is moved in the directions of X and Y in such a way that a desired etching area on the sample 13 is located right under the ion beam irradiating area. The valve 18 is opened after the movement of the stage 22 is completed and the reactant gas with the flow rate controlled by the mass flow controller 19 is blown onto the sample 13 and the table 21 is elevated. The pressure sensor 33 is used to detect a rise in pressure within the gas supply pipe 17 at this time and the height of the table 21 is so controlled that the desired distance between the nozzle 14 and the sample 13 may be obtained. After these steps have been taken, the ion beam irradiating operation is conducted to start etching. While the reactant gas is being blown onto the sample 13, the stage 22 is moved in the directions of X and Y to the next etching position after completion of the initial etching. The pressure sensor 33 is also used then to detect a change of pressure in the gas supply pipe 17. The data thus obtained is fed back to the Z-stage controller (not shown) and the height of the table 21 is controlled in order for the pressure in the gas supply pipe 17 to be made constant. This operation under control is repeated in the following.

As demonstrated in this embodiment, the reactant gas is uniformly supplied from the nozzle to the etching area and the flow rate of the reactant gas as well as the distance between the etching area and the nozzle is precisely controlled, whereby the gas concentration in the etching area becomes constant. Uniform etching with excellent reproducibility may be made possible even though the etching area is relocated over a wide range.

Figure 6:
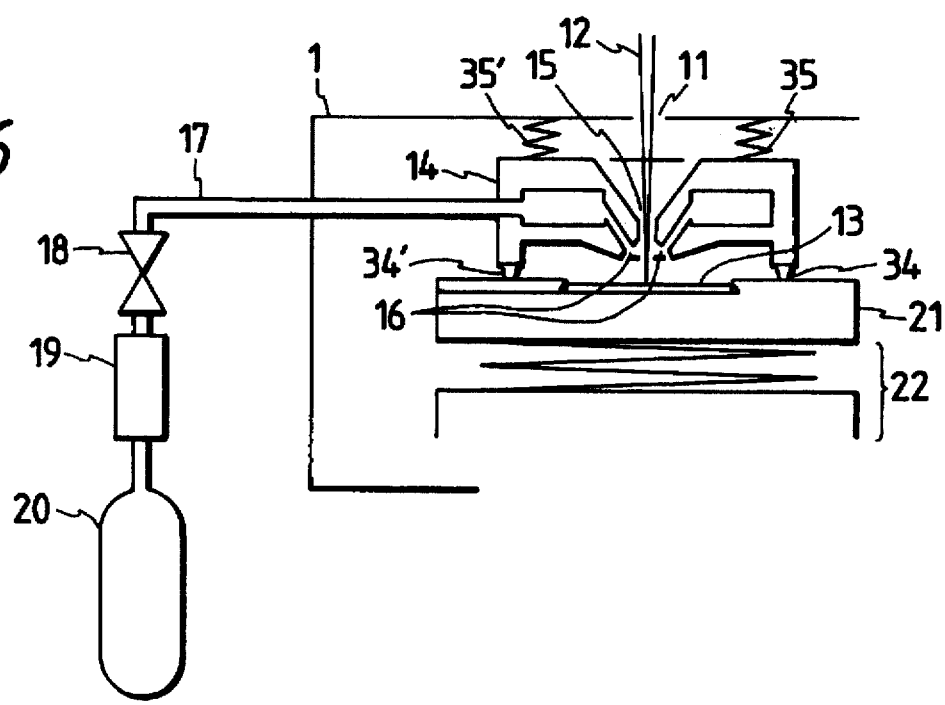
FIG. 6 is a block diagram illustrating the apparatus embodying the present invention with reference to FIG. 5.

FIG. 6 illustrates still another embodiment.

The nozzle 14 shown in the embodiment of FIG. 1 has rollers 34, 34' as stoppers and escape grooves 35, 35'. The embodiment illustrated in FIG. 6 is otherwise similar in constitution and function to what is illustrated in FIG. 1.

The stage 22 is moved in the directions of X and Y in such a way that a desired etching area on the sample 13 is located right under the ion beam irradiation area 12. The table 21 is elevated until it comes into contact with the rollers 34, 34' fitted to the nozzle 14 after the movement of the stage 22 in the directions of X and Y is completed. As the escape grooves 35, 35' have been provided on the nozzle side, the table 21 is caused to stop at a position where it slightly pushes up the nozzle 14 and where a limit switch detects the upper limit of its movement. After these steps have been taken, the valve 18 is opened and the reactant gas with the flow rate controlled by the mass flow controller 19 is blown onto the sample 13, which is simultaneously irradiated with the ion beam 12. Etching is thus started. When the stage 22 is moved in the directions of X and Y after completion of the initial etching, the table 21 is moved in such a state that it is kept in contact with the rollers 34, 34' as stoppers. This operation under control is repeated in the following.

As demonstrated in this embodiment, the reactant gas is uniformly supplied from the nozzle to the etching area and the flow rate of the reactant gas is precisely controlled with the fixed distance between the etching area and the nozzle, whereby the gas concentration in the etching area becomes constant. Uniform etching with excellent reproducibility may be made possible even though the etching area is relocated over a wide range.

The present invention is intended to provide a charged particle beam processing apparatus capable of uniformly supplying a reactant gas to an etching area on a sample and observing a high contrast secondary particle microscope image. According to the present invention, moreover, a gas supply means is provided with a means for uniformly blowing the reactant gas onto the etching area of the sample and a secondary particle detector is provided with a means for observing the high contrast secondary particle microscope image.

Further, the present invention provides arrangements including coaxially installing a gas nozzle in a substantially discoidal form and the secondary particle detector, furnishing a passage for the charged particle beam in the central parts of both members, forming a hollow room for the reactant gas in the gas nozzle, forming the central part of the gas nozzle in such a way as not to impede the incidence of the secondary particles on the secondary particle detector, circumferentially fitting a plurality of gas blowing pipes to the gas nozzle at equal intervals, communicating the entrance side end of each gas blowing pipe with the hollow room, and disposing the exit end side thereof in such a way that the reactant gas can be blown onto the etching area of the sample, According to the present invention, moreover, a gas supply pipe as a means for supplying the reactant gas is installed above the secondary particle detector and a passage for use in letting pass the charged particle beam toward the sample and blowing the reactant gas onto the etching area of the sample from right above is provided for the gas supply pipe.

According to the present invention, moreover, a secondary particle lead-in electrode is disposed on the secondary particle detecting face side of the secondary particle detector.

Further, the present invention provides arrangements including forming the gas nozzle in a substantially discoidal form, furnishing the passage for letting pass the charged particle beam in the center of the gas nozzle, forming a hollow room for the reactant gas in the gas nozzle, circumferentially fitting the plurality of gas blowing pipes to the gas nozzle at equal intervals, communicating the entrance side end of each gas blowing pipe with the hollow room, and disposing the exit end side thereof in such a way that the reactant gas can be blown onto the etching area of the sample, and arranging the secondary particle detector having a scintillator and a photomultiplier in the space between the side of the gas nozzle and the sample.

Further, the present invention provides arrangements including installing the gas supply pipe in a crank form as a means for supplying the reactant gas, fitting the scintillator to the lower part of the vertical portion disposed on the sample side of the gas supply pipe, fitting a half mirror to the upper part thereof, fitting the photomultiplier to the end on the opposite side of the half mirror in the horizontal portion of the gas supply pipe, the scintillator, the half mirror and the photomultiplier constituting the secondary particle detector, providing a hole in the half mirror, the hole being for use in letting pass the charged particle beam, and providing a hole in the scintillator, the hole being for use in letting pass the charged particle beam and blowing the reactant gas onto the etching area of the sample from right above.

Further, the present invention provides arrangements including coaxially disposing an optical guide formed of transparent material, the gas nozzle made of transparent material in a substantially discoidal form, providing a passage for the charged particle beam in the central parts of the optical guide and the gas nozzle, providing a hole in the central part of the scintillator, the hole being for use in letting pass the charged particle beam and the reactant gas, forming a hollow room for guiding fluorescence in the optical guide, forming the hollow room for guiding the fluorescence and the reactant gas in the gas nozzle, circumferentially providing a plurality of gas jets at equal intervals in the central part of the gas nozzle, communicating the entrance of each gas jet with the hollow room of the gas nozzle, disposing the exit thereof in such a way that the reactant gas can be blown onto the etching area of the sample, arranging the photomultiplier on the side of the hollow room of the optical guide, and forming the secondary particle detector so that the fluorescence emitted from the scintillator passes through the hollow room of the gas nozzle and that of the optical guide and is incident on the photomultiplier.

According to the present invention, moreover, the secondary particle lead-in electrode is provided on the secondary particle detecting face side of the scintillator.

Further, the present invention provides arrangements including forming the gas nozzle made of transparent material in a substantially discoidal form, providing the passage for the charged particle beam in the central part of the gas nozzle, forming the hollow room in the gas nozzle, circumferentially providing the plurality of gas jets at equal intervals around the passage, communicating the entrance of each gas jet with the hollow room, disposing the exit thereof in such a way that the reactant gas can be blown onto the etching area of the sample, arranging the photomultiplier as the secondary particle detector in the upper part of the gas nozzle, and disposing a filter in front of the photomultiplier, the filter being adapted for passing only a wavelength range of fluorescence which is peculiar to the sample and derived from a reaction product of the sample and generated from sputtered particles.

According to the present invention, moreover, an etching gas is employed as the reactant gas for conducting charged particle beam processing in the form of local reactant type etching to implement the present invention effectively.

According to the present invention, moreover, a CVD gas is employed as the reactant gas for conducting charged particle beam processing in the form of local beam deposition to implement the present invention effectively.

A description will subsequently be given of other embodiments.

Figure 9:
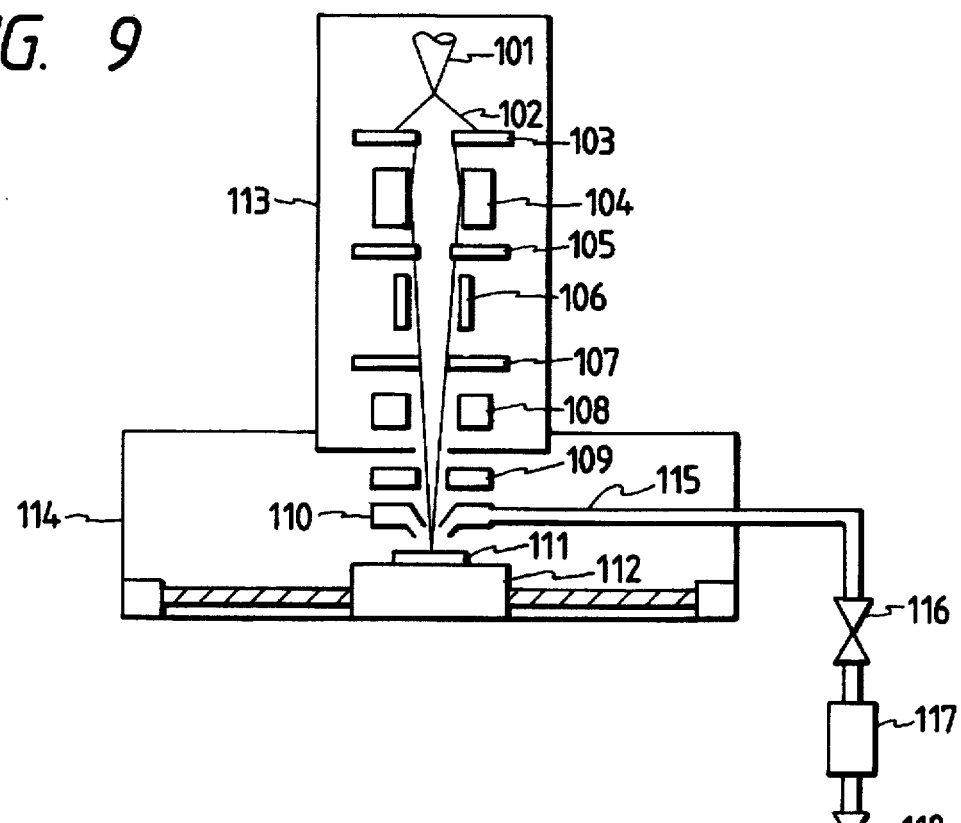
FIG. 9 is an exemplary block diagram showing the overall construction of an apparatus similar to what is shown in FIG. 1 according to the present invention.
Figure 10:
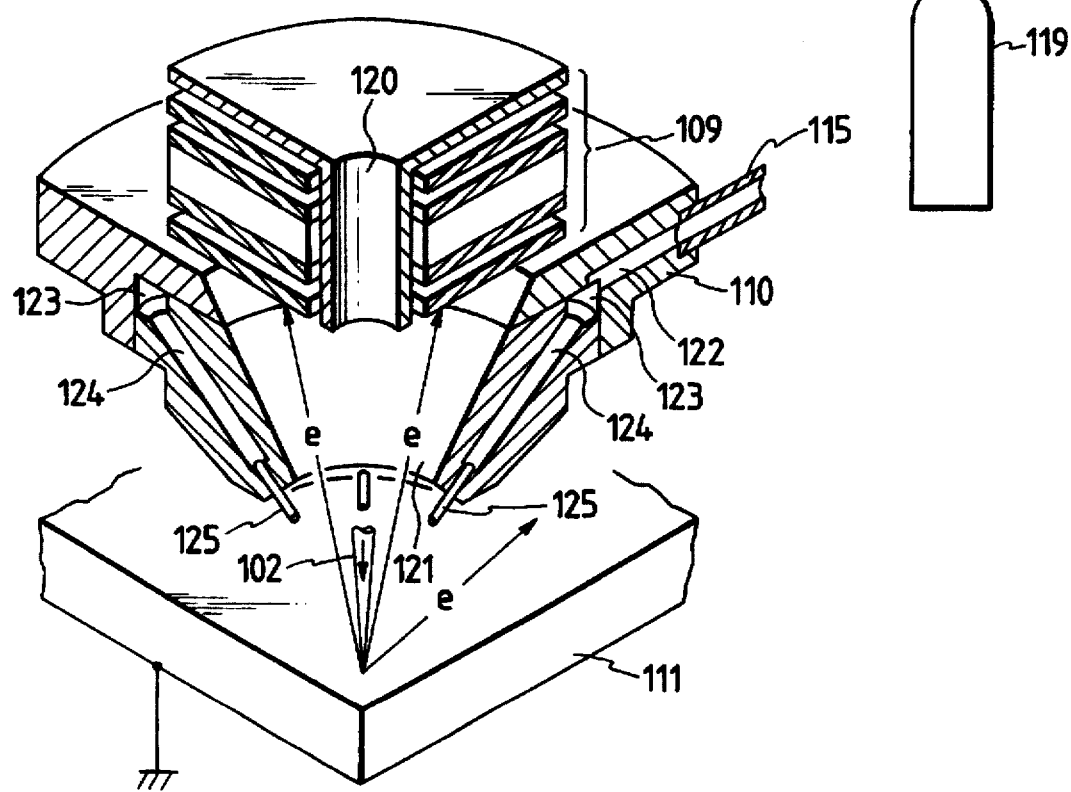
FIG. 10 is a partial broken enlarged strabismus detail view of the microchannel plate and the gas nozzle in the construction of FIG. 9.
Figure 11:
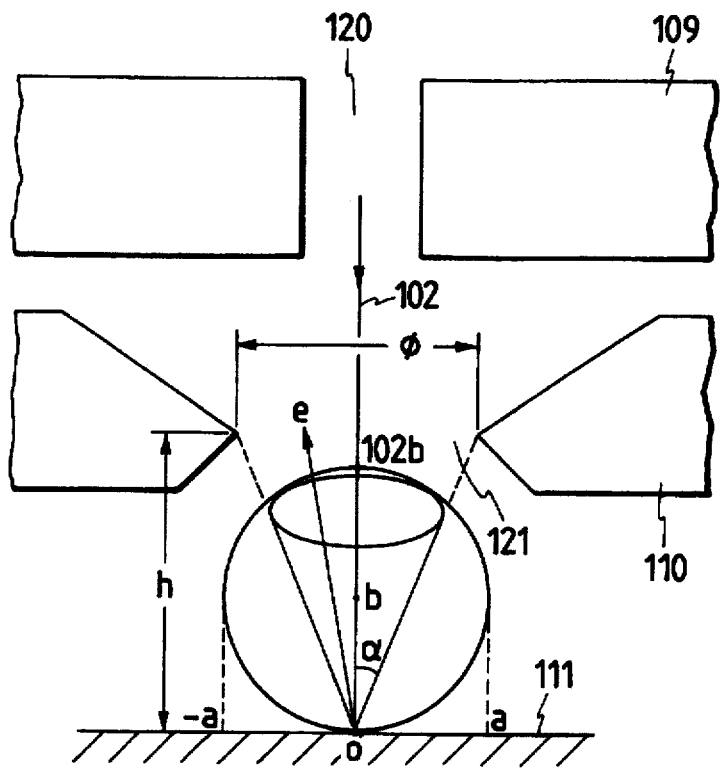
FIG. 11 is a model diagram illustrating second particle detection in the embodiment of FIG. 10.
Figure 12:
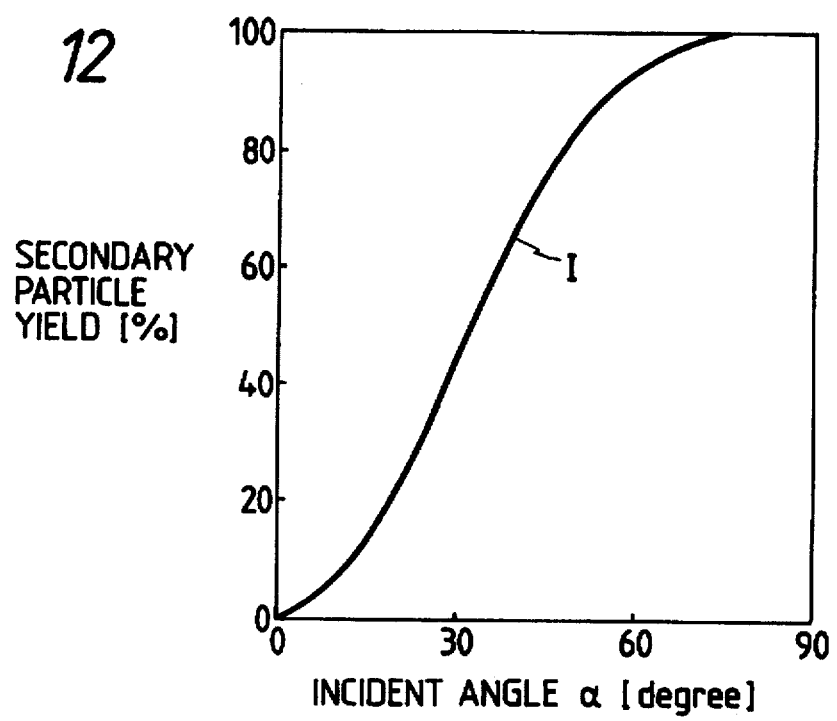
FIG. 12 is a graph showing the relation between a second particle incident angle on the microchannel plate and yield in the embodiment of FIG. 10.

FIGS. 9-12 inclusive, illustrate another embodiment of the present invention: FIG. 9 is an exemplary block diagram showing the construction of an overall apparatus; FIG. 10 is a partial broken enlarged strabismus detail view of a microchannel plate as a secondary particle detector and a gas nozzle; FIG. 11 is a model diagram of second particle detection; and FIG. 12 is a graph showing the relation between a second particle incident angle on the microchannel plate and yield.

Although either ion or electron beams may be used as charged particle beams to perform substantially the same processing, use of focused ion beams is shown herein by way of example.

In these drawings of this embodiment, an ion chamber (hereinafter called 'IB chamber') 113 is placed on a main chamber 114 as shown in FIG. 9.

In the IB chamber 113 is a focused ion beam optical system comprising a lead-in electrode 103 for leading ion beams 102 from a ion source 101, a focusing lens 104 for focusing the ion beams thus led out, an aperture 105, a blanking electrode 106 for making and breaking the ion beams 102, a blanking aperture 107, and a deflecting electrode 108 for deflecting the ion beams 102, the focused ion beam optical system being controlled by an ion beam controller (not shown).

An orifice for letting pass the ion beam 102 and preventing a reactant gas from flowing into the IB chamber 113 is provided in the bottom of the IB chamber 113.

The main chamber 114 accommodates a stage 112 for mounting a sample 111 as a workpiece, a nozzle 110 for blowing the reactant gas onto the sample, and a microchannel plate 109 as a secondary particle detector for detecting secondary particles produced from the sample 111 as it is irradiated with the ion beam 102. The stage 112 for the sample 111 is installed so that an etching area is displaceable through the function of ball screws and nuts. The main chamber 114 is kept vacuous by means of exhaust tubes and exhaust equipment (not shown).

A gas cylinder 119 containing the reactant gas is coupled to the gas nozzle 110 via a gas supply pipe 115, a valve 116, a mass flow controller 117 and a valve 118. The quantity of the reactant gas to be blown from the gas nozzle 110 is controlled by the mass flow controller (not shown).

As shown in FIG. 10, a passage 120 large enough to scan the ion beam 102 is provided in the center of the microchannel plate 109.

As shown in FIGS. 9, 10, the gas nozzle is discoidal in configuration. As shown in FIG. 10, moreover, a conical passage 121 for gradually decreasing the diameter of the ion beam 102 in radial direction is provided in the central part of the gas nozzle 110. Through this conical passage 121, the secondary particles e of the ion beam 102 emitted from the surface of the sample 111 are made incident on the microchannel plate 109. The passage 121 is configured so that the secondary particles e may be incident on the detecting face of the microchannel plate 109 over a range of greater than 45° in terms of the central angle and set at a position considerably far from the surface of the sample 111. A hollow room 123 for the reactant gas is also formed little to the center of the gas nozzle 110 as shown in FIG. 10. The hollow room 123 is coupled to the gas supply pipe 115 via a gas passage 122 provided in the gas nozzle 110. Further, a plurality of gas blowing pipes 125 are circumferentially fitted to the central part of the gas nozzle 110 at equal intervals. The entrance side end of each gas blowing pipe 125 communicates with the hollow room 123 via a gas passage 124 provided in the gas nozzle 110, whereas the exit side end thereof is tilted so as to be able to blow the reactant gas onto the etching area of the sample 111.

When the charged particle beam processing apparatus in this embodiment is used to conduct charged particle beam processing, ion beams 102 are led from the ion source 101 shown in FIG. 9 via the lead-in electrode 103 and the ion beams 102 are focused by means of the focussing lens 104, the aperture 105, the blanking electrode 106, the blanking aperture 107 and the deflecting electrode 108. The sample 111 is then irradiated with the ion beam 102 passed through the passage 120 provided in the microchannel plate 109 as a secondary particle detector and the passage provided in the gas nozzle 110 as shown in FIG. 10. As the sample 111 is irradiated with the ion beam 102, secondary particles e are emitted from the surface of the sample 111. The secondary particles e emitted from the surface of the sample 111 are incident on the microchannel plate 109 and a secondary particle image is obtained by detecting them. While the surface of the sample 111 is observed with the secondary particle image, the stage 112 for the sample 111 is moved so as to determine an etching area. The reactant gas is caused to flow from the gas cylinder 119 via the valve 118 to the mass flow controller 117 after the etching area is determined as shown in FIG. 9, the flow rate of the reactant gas being controlled by the mass flow controller 117. The reactant gas is then passed through the valve 116, the gas supply pipe 115 and the gas passage 122 provided in the gas nozzle 110 before being led into the hollow room 123 for the reactant gas. Subsequently, the reactant gas is blown onto the etching area of the sample 111 via the gas passage 124 and the plurality of gas blowing pipes 125 fitted to the gas nozzle 110. Since the plurality of gas blowing pipes 125 are circumferentially fitted to the gas nozzle 110 at equal intervals in such a way that the exit side end of each one is capable of blowing the reactant gas onto the etching area of the sample 111, the reactant gas can be supplied to the etching area of the sample 111 definitely and uniformly.

The charged particle beam processing may be implemented by either reactant type etching using an etching gas or beam assisted deposition using a CVD gas. Moreover, use can be made of an etching gas of such as $Cl_2$, $SiCl_4$, $CF_4$, $XeF_2$. As for the CVD gas, $W(CO)_5$, $Mo(CO)_6$ and the like are applicable thereto.

Referring to FIGS. 11, 12, the effect of giving the secondary particle image a high contrast in this embodiment.

When the sample 111 is irradiated with the ion beam 102, the secondary particles e emitted from the surface of the sample 111 normally exhibits cosine distribution as shown in FIG. 11. The quantity of them incident on the microchannel plate 109 at this time is equivalent to only what is led in through the passage 121 provided in the central part of the gas nozzle 110. Given the center point and the length of the outer diameter of the cosine distribution are a and b, the volume VO of the cosine distribution is expressed by $$Vo = 4/3\, \pi b a^2 \quad \ldots \quad (1)$$

and the volume V of a section with diagonal lines is given by $$V = 8\pi a^4 b^3/3(b^2 + a^2 \tan^2\alpha)\, \{\tan^2\alpha(a^2\tan^2\alpha+1)/b^2 + a^2\tan^2\alpha + 1/2a^2\}. \quad (2)$$

From these two equations, the relation between the yield V/VO of the secondary particles e incident on the microchannel plate 109 and the incident angle may be represented by a graph shown in FIG. 12. Assuming the diameter $\phi$ of the passage 121 in the central part of the gas nozzle 110 to be 800 μm and the distance h between the gas nozzle 110 and the sample 111 to be 500 μm, the incident angle α becomes about 39°. The yield of the secondary particles e then is 64% as is obvious from a curve I of FIG. 12.

On the other hand, the plurality of gas blowing pipes 123 are circumferentially fitted to the gas nozzle 110 at equal intervals and the reactant gas is blown onto the etching area on the surface of the sample 111 through the gas blowing pipes 123 in this embodiment as shown in FIG. 2. As a result, the diameter $\phi$ of the passage 121 in the central part of the gas nozzle 110 can be set larger, whereby the yield of the secondary particles e is improvable. If the diameter $\phi$ of the passage 121 in the central part of the gas nozzle 110 is set to 1.2 mm, for instance, the yield of secondary particles e reaches 80% and almost all of the secondary particles e emitted from the sample 11 into the microchannel plate 109 may be collected. Consequently, the observation of a high contrast secondary particle microscope image becomes possible.

Therefore, uniformly supplying the reactant gas to the etching area on the sample 111 is made compatible with observing the high contrast secondary particle microscope image of the ion beam 102 in this embodiment.

Figure 13:
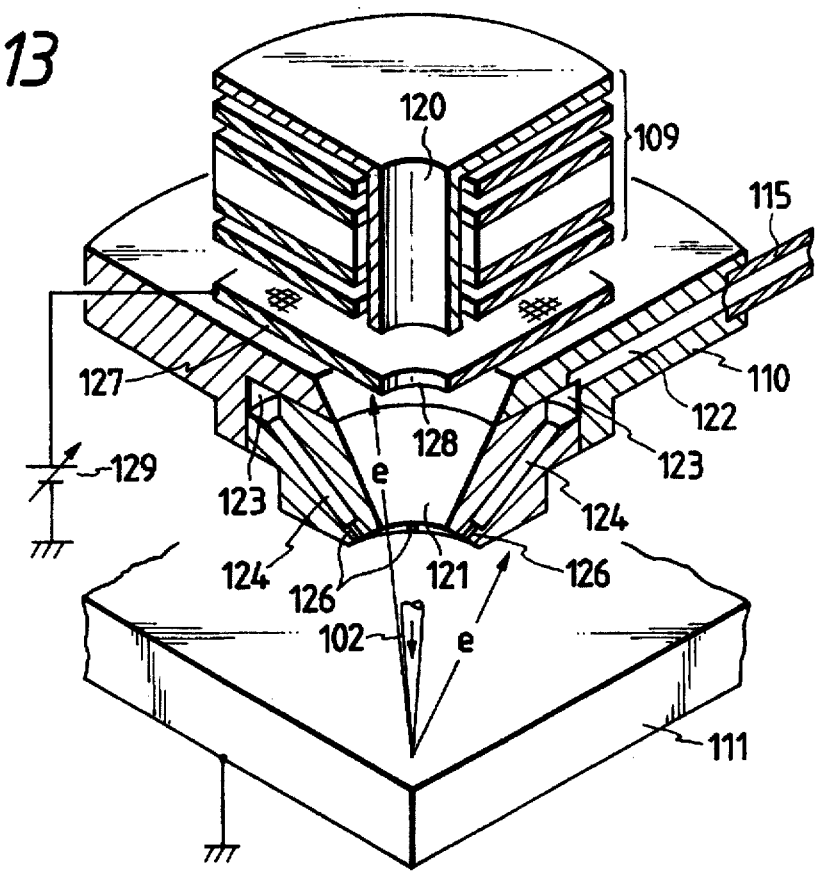
FIG. 13 is a partial broken enlarged strabismus detail view of a microchannel plate, a gas nozzle and a second particle lead-in electrode in another embodiment of the present invention.
Figure 14:
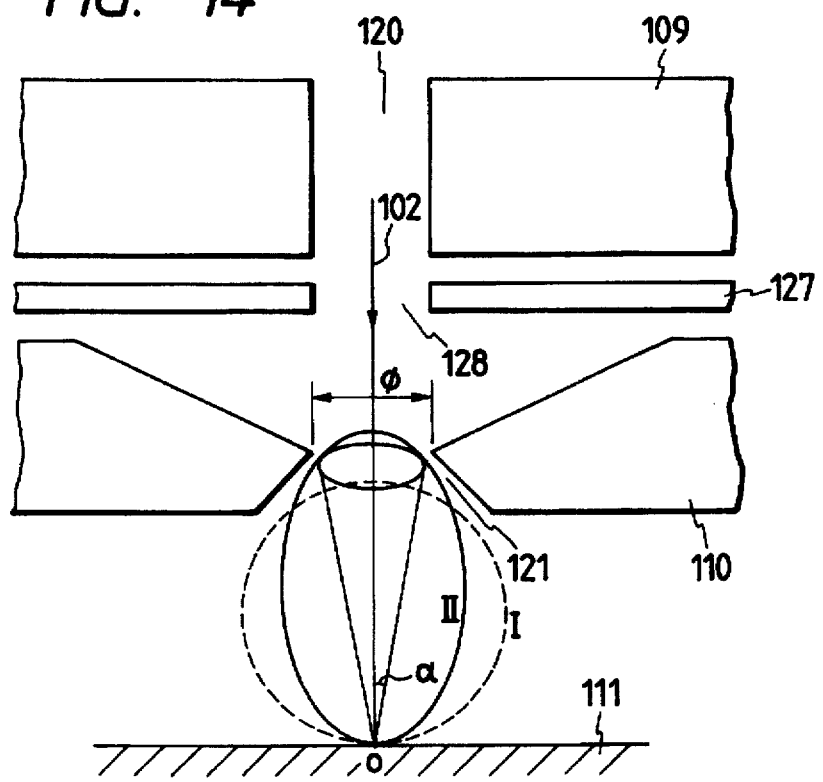
FIG. 14 a model diagram illustrating second particle detection in the embodiment of FIG. 13.
Figure 15:
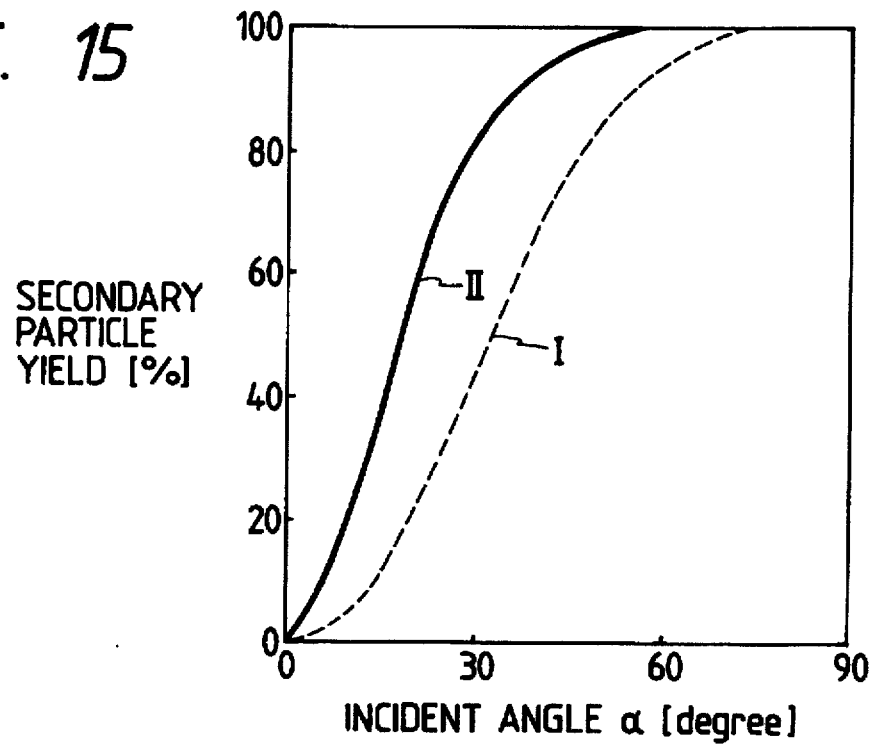
FIG. 15 a graph showing the relation between a second particle incident angle on the microchannel plate and yield in the embodiment of FIG. 13.

FIGS. 13–15 inclusive, illustrate still another embodiment of the present invention: FIG. 13 is a partial broken enlarged strabismus detail view of a microchannel plate, a gas nozzle and a second particle lead-in electrode; FIG. 14 a model diagram illustrating second particle detection; and FIG. 15 a graph showing the relation between a second particle incident angle on the microchannel plate and a yield of secondary particles.

As shown in FIGS. 13, 14, a mesh lead-in electrode 127 is arranged between the microchannel plate 109 and the gas nozzle 110 in this embodiment. A hole 128 large enough to allow the ion beam to pass therethrough is provided in the central part of the lead-in electrode 127. A power supply 129 is also connected to the lead-in electrode 127.

A plurality of gas blowing pipes 126 are circumferentially fitted to the central part of the gas nozzle 110 at equal intervals. The entrance side end of each gas blowing pipe 126 communicates with the hollow room 123 via a gas passage 124 provided in the gas nozzle 110, whereas the exit side end thereof is provided so as to be able to blow the reactant gas onto the etching area of the sample 111.

Approximately +500 V is applied from the power supply 129 to the lead-in electrode 127 to lead in the secondary particles e. When the voltage is applied to the lead-in electrode 127, the secondary particles e emitted from the surface of the sample 111 due to the irradiation of the ion beam 102 are forced to pass through the passage 121 provided in the central part of the gas nozzle 110 because of the voltage applied to the lead-in electrode 127 for acceleration and is incident on the microchannel plate 109 before being detected. In this case, the distribution of the secondary particles e emitted from the surface of the sample 111 becomes, as shown in FIG. 14, overcosine distribution as represented by a vertically-extended curve II. FIG. 15 depicts the relation between the incident angle α of the secondary particles e incident on the microchannel plate 109 from the point irradiated with the ion beam 102 and the yield of the secondary particles e; in other words, it results in the curve II which appears to have shifted toward smaller incident angles α rather than the curve I representing the yield of cosine distribution in a case where the lead-in electrode is not provided.

As is obvious from FIG. 15, the secondary particles e can be made incident on the microchannel plate 109 efficiently because of the function of the lead-in electrode 127 provided between the microchannel plate 109 and the gas nozzle 110 even when the incident angle of the secondary particles e incident on the microchannel plate 109 through the passage 121 provided in the central part of the gas nozzle 110 is small and consequently a high contrast secondary particle microscope image becomes observable in this embodiment.

Since the reactant gas is so arranged as to be blown onto the etching area of the sample 111 through the plurality of gas blowing jets 126 circumferentially fitted to the gas nozzle 110 at equal intervals, it can be supplied uniformly to the etching area on the sample 111.

Therefore, uniformly supplying the reactant gas to the etching area on the sample 111 is made compatible with observing the high contrast secondary particle microscope image even in this embodiment.

This embodiment is otherwise similar in constitution and function to those described above.

Figure 16:
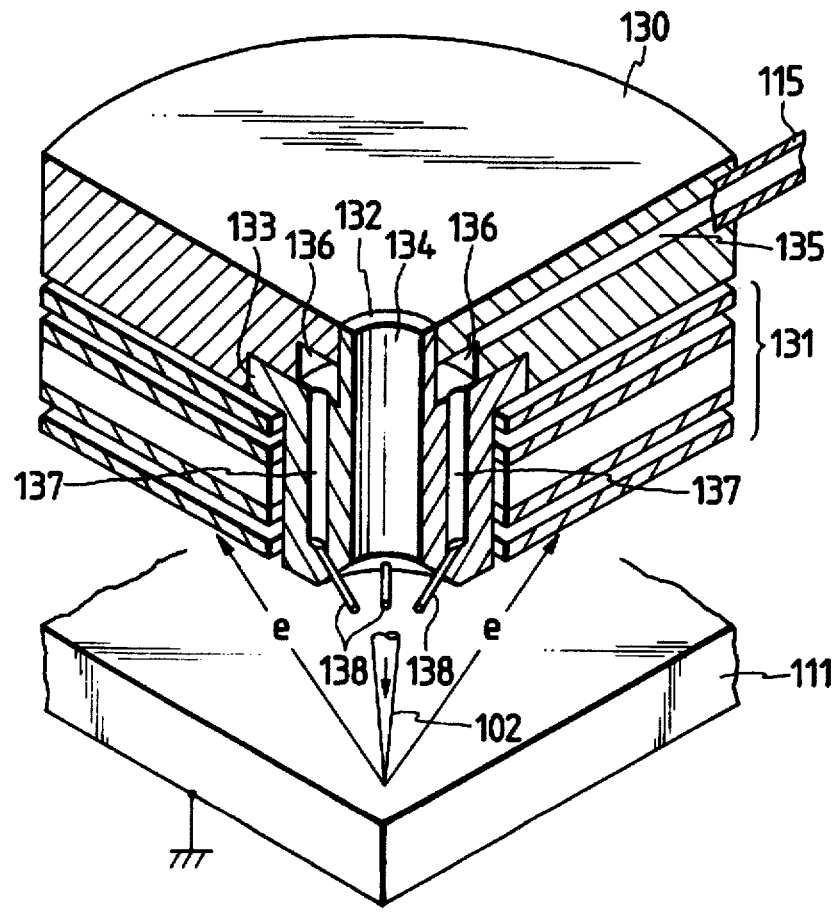
FIG. 16 is a partial broken enlarged strabismus detail view of a gas nozzle and a microchannel plate in still another embodiment of the present invention.
Figure 17:
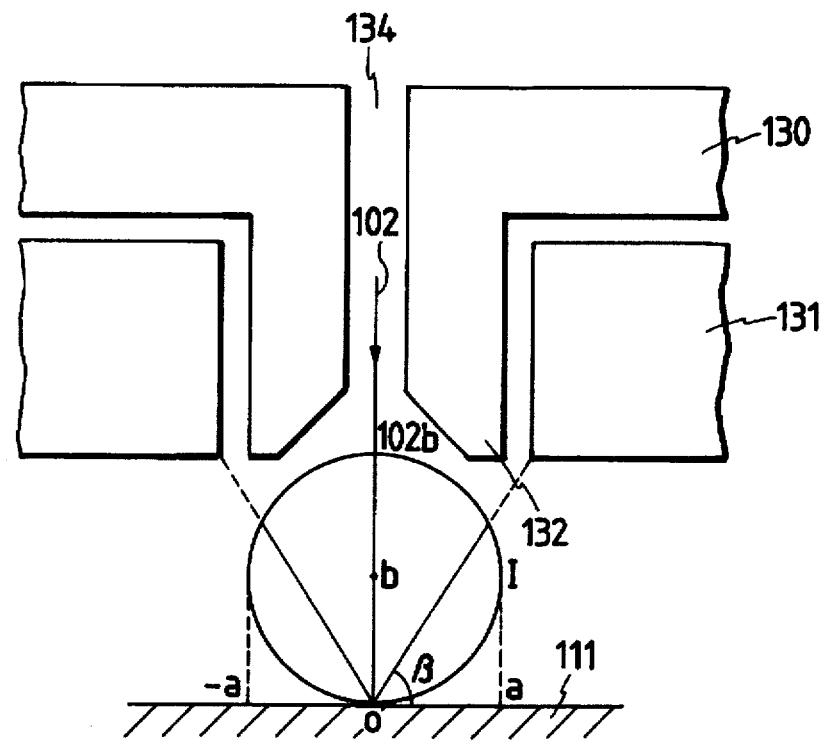
FIG. 17 is a model diagram illustrating second particle detection in the embodiment of FIG. 16.
Figure 18:
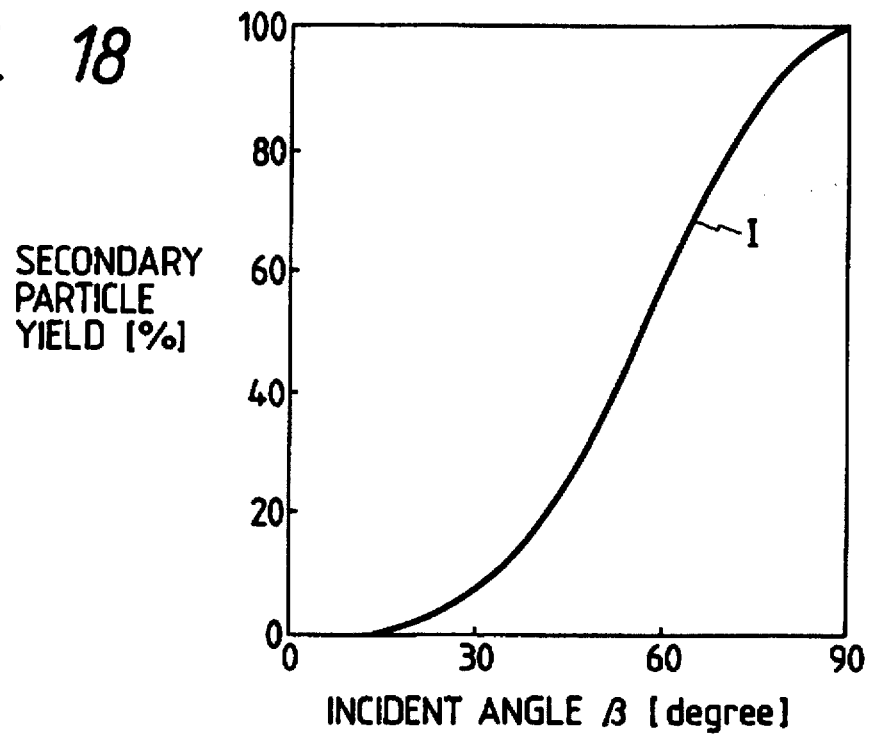
FIG. 18 is a graph showing the relation between a second particle incident angle on the microchannel plate and yield in the embodiment of FIG. 16.

FIGS. 16–18 inclusive, illustrate still another embodiment of the present invention; FIG. 16 is a partial broken enlarged strabismus detail view of a gas nozzle and a microchannel plate; FIG. 17 is a model diagram illustrating second particle detection; and FIG. 18 is a graph showing the relation between a second particle incident angle on the microchannel plate and yield.

In this embodiment of FIG. 16, a gas nozzle 130 and a microchannel plate 131 are coaxially installed, the latter 131 being disposed under the former 130. Through-holes are provided in the central parts of the gas nozzle 130 and the microchannel plate 131, respectively.

A sleeve 132 is fitted to the through-hole. A fitting flange 133 is provided for the sleeve 132 and a passage 134 for letting pass the ion beam 102 is also provided therein. The gas nozzle 130 and the microchannel plate 131 are combined via the sleeve 132.

A hollow room 136 for the reactant gas is formed in the gas nozzle 130.

The hollow room 136 is coupled via a passage 135 to the gas supply pipe 115. On the other hand, a plurality of gas blowing pipes 138 are circumferentially fitted to the lower part of the sleeve 132 at equal intervals. The entrance side end of each gas blowing pipe 138 communicates with the hollow room 136 via a gas passage 137, whereas the exist side end thereof is disposed so that the reactant gas may be blown onto the etching area of the sample 111.

In this embodiment of FIG. 16 thus constituted, the surface of the sample 111 is irradiated with the ion beam 102 via the passage 134 provided in the sleeve 132. The secondary particles e emitted from the surface of the sample 111 as the ion beam 102 is irradiated are directly incident on the detecting face of the microchannel plate 131. The secondary particle image is obtained by detecting the secondary particles e so as to determine the etching area on the sample 111.

The reactant gas is led into the hollow room 136 formed in the gas nozzle 130 from the gas passage 135 provided in the gas nozzle 130. Subsequently, the reactant gas passes through a gas passage 137 provided in the sleeve 132 and is blown onto the etching area of the sample 111 via the gas blowing pipes 138 fitted to the sleeve 132. As the reactant gas is blown via the plurality of gas blowing pipes 138 circumferentially fitted to the lower part of the sleeve 132 at equal intervals and disposed so that the reactant gas may be blown onto the etching area of the sample 111, the reactant gas can be supplied to the etching area surely and uniformly.

As shown in FIG. 17, the distribution of the secondary particles e emitted as the surface of the sample 111 is irradiated with the ion beam 102 becomes cosine distribution and the incident area of the microchannel plate 131 corresponds to what is equivalent to an incident angle β from the point where the ion beam 102 is irradiated to the detecting face of the microchannel plate 131. FIG. 18 shows the relation between the incident angle β and the ratio of the volume of the whole cosine distribution to the volume of the incident portion of the microchannel plate 131, that is, the yield of the secondary particles e. As is obvious from FIG. 18, the yield of the secondary particles e enlarges as the incident angle β increases. In this case, it is only needed to increase the distance between the sample 111 and the microchannel plate 131 to enlarge the incident angle β. Therefore, the gas nozzle 130 and the microchannel plate 131 are integrally formed via the sleeve 132 and the plurality of gas blowing pipes 137 are circumferentially fitted to the lower side of the sleeve 132 at equal intervals and besides the exit side end of each gas blowing pipe 137 is disposed so that the reactant gas may be blown onto the etching area of the sample 111 in this embodiment. As the reactant gas can thus be blown uniformly onto the etching area of the sample 111, the distance between the sample 111 and the microchannel plate 131 is enlarged with the effect of improving the yield of the secondary particles e.

Accordingly, uniformly supplying the reactant gas to the etching area on the sample 111 is made compatible with observing a high contrast secondary particle microscope image even in this embodiment.

Figure 19:
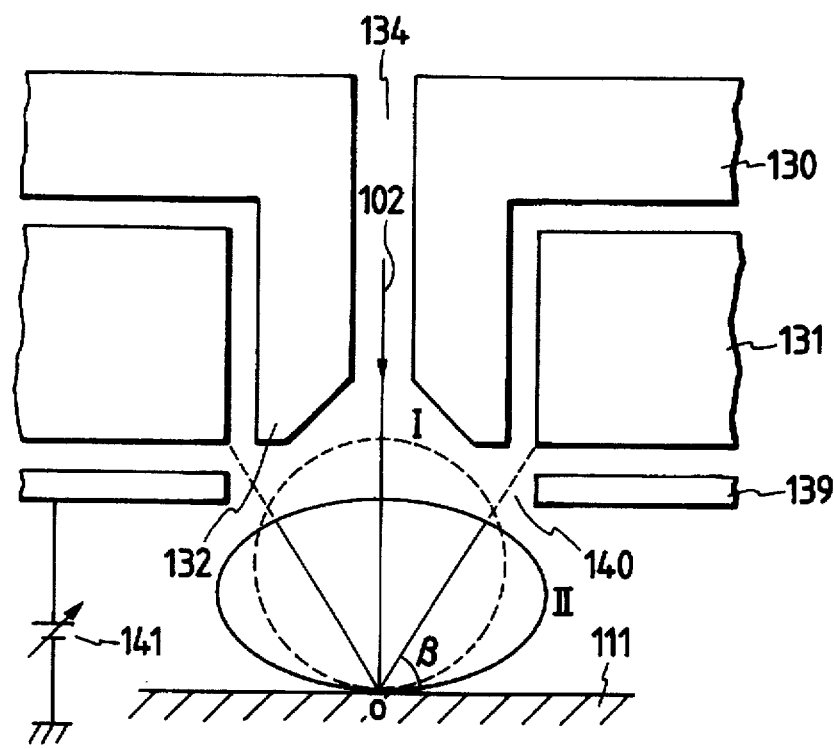
FIG. 19 is a model diagram illustrating second particle detection in still another embodiment of the present invention.
Figure 20:
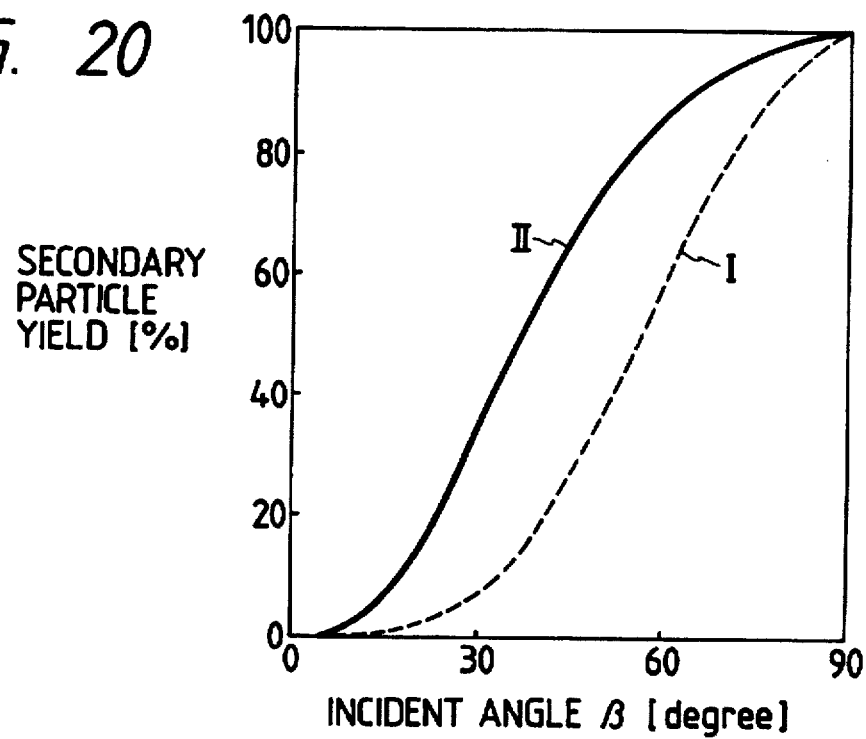
FIG. 20 is a graph showing the relation between a second particle incident angle on the microchannel plate and yield in the embodiment of FIG. 19.

FIGS. 19, 20 illustrate still another embodiment of the present invention: FIG. 19 is a model diagram illustrating second particle detection; and FIG. 20 is a graph showing the relation between a second particle incident angle on the microchannel plate and yield.

In this embodiment, a lead-in electrode 139 is arranged on the secondary particles e detecting face of the microchannel plate 131. A hole 140 large enough not to impede the passage of the ion beam 102 and the reactant gas is provided in the central part of the lead-in electrode 139. Moreover, the lead-in electrode 139 is provided with a power supply 141 for applying voltage for use in leading in the secondary particles e.

In this embodiment, the distribution of the secondary particles e emitted from the sample 111 with the irradiation of the ion beam 102 is changed by the voltage applied from the power supply 141 to the lead-in electrode 139, from the cosine distribution (see curve I of FIG. 20) in the third embodiment above to a laterally-extended undercosine curve distribution (see curve II of FIG. 20). FIG. 20 shows a curve II representing the relation between the incident angle β of the secondary particles e and the ratio of the volume of the whole undercosine distribution to the volume of the incident angle β portion, that is, the yield of the secondary particles e. As is obvious from FIG. 20, the secondary particles e are fully detectable even when the incident angle β is small and this makes possible the observation of a high contrast secondary particle microscope image.

This embodiment is otherwise similar in constitution and function to what is illustrated in FIG. 16 and the like.

Figure 21:
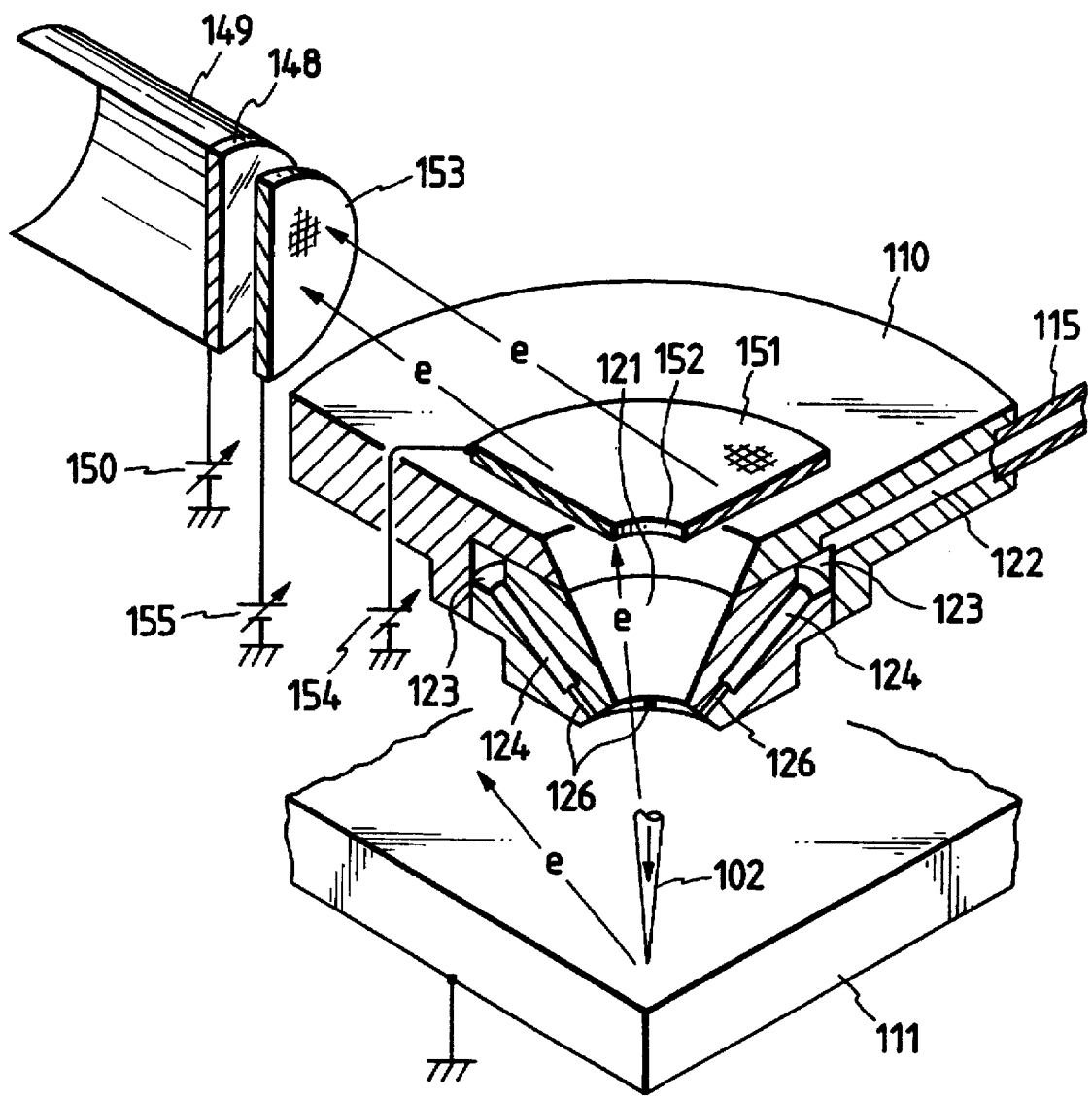
FIG. 21 is a partial broken enlarged strabismus detail view of a gas nozzle, a second particle detector, and a first and a second lead-in electrodes in still another embodiment of the present invention.

FIG. 21 illustrates still another embodiment of the present invention and is a partial broken enlarged strabismus detail view of a gas nozzle, a second particle detector, and a first and a second lead-in electrodes.

This embodiment includes a first mesh lead-in electrode 151 located above the gas nozzle 110 and a second mesh lead-in electrode 153 in front of a scintillator 148 forming the secondary particle detector.

A hole 152 large enough to scan the ion beam 102 is provided in the central part of the first lead-in electrode 151. This first lead-in electrode 151 is arranged in such a way that the hole 152 corresponds to the center line of the passage provided in the gas nozzle 110. Moreover, a power supply 154 is coupled to the first lead-in electrode 151.

The second lead-in electrode 153 is installed in a position fit for making efficiently incident the secondary particles e of the ion beam 102 boosted by the first lead-in electrode 151. A power supply 155 is coupled to the second lead-in electrode 153.

In the embodiment constituted as shown in FIG. 21, the sample 111 is irradiated with the ion beam 102 that has passed through the hole 152 provided in the first lead-in electrode 151 and the passage 121 provided in the gas nozzle 110. The voltage for use in leading in the secondary particles e has been applied from the power supplies 154, 155 to the first and the second lead-in electrodes 151, 153 during that time. The secondary particles e emitted from the sample 111 are passed through the passage 121 provided in the gas nozzle 110, boosted by the first lead-in electrode 151, subsequently led from the first lead-in electrode 151 into the second lead-in electrode 153 and then incident on the scintillator 148.

As the secondary particles e emitted from the sample 111 are thereby made incident efficiently, the observation of a higher contrast secondary particle microscope image is rendered feasible.

The embodiment illustrated in FIG. 21 is otherwise similar in constitution and function to what is illustrated in FIGS. 13–15.

According to the present invention as claimed in claim 7, as means for uniformly blowing the reactant gas onto the etching area of the sample and for observing a high contrast secondary particle microscope image are respectively provided for the gas supply means and the secondary particle detector, it has the effect of not only uniformly supplying the reactant gas onto the etching area of the sample but also making it possible to observe the high contrast secondary particle microscope image.

According to the present invention as claimed in claims 8–10, moreover, the arrangements made thereby include coaxially installing the gas nozzle in a substantially discoidal form and the secondary particle detector, furnishing the passage for the charged particle beam in the centers of both members, forming the hollow room for the reactant gas in the gas nozzle, forming the central part of the gas nozzle in such a way as not to impede the incidence of the secondary particles on the secondary particle detector, circumferentially fitting the plurality of gas blowing pipes to the gas nozzle at equal intervals, communicating the entrance side end of each gas blowing pipe with the hollow room, and disposing the exit end side thereof in such a way that the reactant gas can be blown onto the etching area Of the sample. Even though the distance between the secondary particle detecting face of the secondary particle detector and the sample is sufficiently enlarged, the reactant gas is uniformly supplied via the plurality of gas blowing pipes circumferentially fitted at equal intervals to the etching area of the sample. As gas nozzle is formed so as not to impede the incidence of the secondary particles on the secondary particle detector, moreover, the yield of the secondary particles emitted from the surface of the sample and incident on the secondary particle detector is made improvable with the effect of making compatible uniformly supplying the reactant gas to the etching area on the sample with observing the high contrast secondary particle microscope image of the ion beam.

According to the present invention as claimed in claim 11, the gas supply pipe as a means for supplying the reactant gas is installed above the secondary particle detector and the passage for use in letting pass the charged particle beam toward the sample and blowing the reactant gas onto the etching area of the sample from right above is provided for the gas supply pipe. The secondary particles emitted from the surface of the sample by irradiating it with the charged particle beam are directly incident on the detecting face of the secondary particle detector, whereas the reactant gas is passed through the gas supply pipe and blown onto the etching area of the sample from right above via the passage provided in the gas supply pipe, whereby uniformly supplying the reactant gas to the etching area on the sample is made compatible with observing the high contrast secondary particle microscope image of the ion beam as claimed in claim 11.

According to the present invention as claimed in claim 12, since the secondary particle lead-in electrode is arranged on the secondary particle detecting face of the secondary particle detector, the secondary particles are forced into the secondary particle detector with the effect of rendering feasible the observation of a higher contrast secondary particle microscope image.

According to the present invention as claimed in claim 13, further, arrangements made thereby include forming the gas nozzle in a substantially discoidal form, furnishing the passage for letting pass the charged particle beam in the center of the gas nozzle, forming the hollow room for the reactant gas in the gas nozzle, circumferentially fitting the plurality of gas blowing pipes to the gas nozzle at equal intervals, communicating the entrance side end of each gas blowing pipe with the hollow room, and disposing the exit end side thereof in such a way that the reactant gas can be blown onto the etching area of the sample, and arranging the secondary particle detector having a scintillator and a photomultiplier in the space between the side of the gas nozzle and the sample. Even though the secondary particle detector is disposed in the space between the gas nozzle side and the sample by increasing the distance between the gas nozzle and the sample, a space for the secondary particles to be effectively incident on the secondary particle detector is secured as the plurality of gas blowing pipes are circumferentially fitted to the gas nozzle at equal intervals with the exit side end of each pipe being disposed in such a way as to be able to uniformly blow the reactant gas onto the etching area of the sample. The reactant gas is thus uniformly supplied to the etching area of the sample and therefore uniformly supplying the reactant gas to the etching area on the sample is made compatible with observing the high contrast secondary particle microscope image of the ion beam even in the invention as claimed in claim 13.

According to the present invention as claimed in claim 14, further, arrangements made thereby include installing the gas supply pipe in a crank form as a means for supplying the reactant gas, fitting the scintillator to the lower part of the vertical portion disposed on the sample side of the gas supply pipe, fitting the half mirror to the upper part thereof, fitting the photomultiplier to the end on the opposite side of the half mirror in the horizontal portion of the gas supply pipe; the scintillator, the half mirror and the photomultiplier constituting the secondary particle detector, providing a hole in the half mirror, the hole being for use in letting pass the charged particle beam, and providing a hole in the scintillator, the hole being for use in letting pass the charged particle beam and blowing the reactant gas onto the etching area of the sample from right above. As the reactant gas is blown onto the etching area of the sample from right above, it can be supplied uniformly to the etching area of the sample and as the secondary particles emitted from the surface of the sample are directly incident on the scintillator of the secondary particle detector with the effect of rendering feasible the observation of a higher contrast secondary particle microscope image. As a result, uniformly supplying the reactant gas to the etching area on the sample is made compatible with observing the high contrast secondary particle microscope image of the ion beam even in the invention as claimed in claim 6.

According to the present invention as claimed in claim 15, further, arrangements made thereby include coaxially disposing the optical guide formed of transparent material, the gas nozzle made of transparent material in a substantially discoidal form, providing a passage for the charged particle beam in the central parts of the optical guide and the gas nozzle, providing a hole in the central part of the scintillator, the hole being for use in letting pass the charged particle beam and the reactant gas, forming the hollow room for guiding fluorescence in the optical guide, forming the hollow room for guiding the fluorescence and the reactant gas in the gas nozzle, circumferentially providing the plurality of gas jets at equal intervals in the central part of the gas nozzle, communicating the entrance of each gas jet with the hollow room of the gas nozzle, disposing the exit thereof in such a way that the reactant gas can be blown onto the etching area of the sample, arranging the photomultiplier on the side of the hollow room of the optical guide, and forming the secondary particle detector so that the fluorescence emitted from the scintillator passes through the hollow room of the gas nozzle and that of the optical guide and is incident on the photomultiplier. The secondary particles emitted from the sample by irradiating its surface with the charged particle beam are made directly incident on the scintillator of the secondary particle detector. The fluorescence generated from the scintillator is caused to pass through the hollow room formed in the gas nozzle made of transparent material and further the hollow room formed in the optical guide made of transparent material. The fluorescence is incident on the photomultiplier provided on the side of the hollow room of the optical guide and before being output as an voltage signal, converted by the photomultiplier into voltage. The acquisition of the secondary particle image is based on the output above. The reactant gas is led into the hollow room formed in the gas nozzle and uniformly blown onto the etching area of the sample via the plurality of gas blowing pipes circumferentially provided at equal intervals with each exit capable of blowing the reactant gas onto the etching area of the sample. Therefore, uniformly supplying the reactant gas to the etching area on the sample is made compatible with observing the high contrast secondary particle microscope image of the ion beam even in the invention as claimed in claim 15.

According to the present invention as claimed in claim 16, since the secondary particle lead-in electrode is arranged on the secondary particle detecting face of the secondary particle detector, the secondary particles of the scintillator are forced into the scintillator with the effect of rendering more feasible the observation of a higher contrast secondary particle microscope image.

According to the present invention as claimed in claim 17, the arrangements made thereby include forming the gas nozzle of transparent material, providing the charged particle beam in the central part of the gas nozzle, forming hollow room in the gas nozzle, circumferentially providing the plurality of gas blowing jets on the passage at equal intervals Further, the present invention provides arrangements including coaxially disposing an optical guide formed of transparent material, the gas nozzle made of transparent material in a substantially discoidal form, providing a passage for the charged particle beam in the central parts of the optical guide and the gas nozzle, providing a hole in the central part of the scintillator, the hole being for use in letting pass the charged particle beam and the reactant gas, forming a hollow room for guiding fluorescence in the optical guide, forming the hollow room for guiding the fluorescence and the reactant gas in the gas nozzle, circumferentially providing a plurality of gas jets at equal intervals in the central part of the gas nozzle, communicating the entrance of each gas jet with the hollow room of the gas nozzle, disposing the exit thereof in such a way that the reactant gas can be blown onto the etching area of the sample, installing the photomultiplier as the secondary particle detector above the gas nozzle, and arranging the filter in front of the photomultiplier, the filter being adapted for passing only a wavelength range of fluorescence which is peculiar to the sample and derived from a reaction product of the sample and generated from sputtered particles. The reactant gas can be supplied uniformly to the etching area of the sample through the plurality of gas blowing jets provided circumferentially about the central part of the gas nozzle at equal intervals. With the gas nozzle formed of transparent material, the plurality of photomultipliers as secondary particle detectors installed upward and the filter in front of each photomultiplier, moreover, a high contrast secondary particle microscope image is effectively observable.

According to the present invention as claimed in claim 18, an etching gas is employed as the reactant gas and used for charged particle beam processing in which local reactant type etching is conducted. According to the invention as claimed in claim 19, a CVD gas is employed as the reactant gas and used for charged particle beam processing in which local beam deposition is conducted. Such charged particle beam processing can effectively be performed accordingly.

The present invention relates to a charged particle beam processing method for selectively forming an insulation layer on the side wall of a hole etched by making use of the difference in reaction velocity between etching and deposition reactions, the method comprising the step of supplying a mixed gas resulting from mixing a reactive etching gas with a deposition gas depositing an insulating material simultaneously when local reactant type etching is conducted in a charged particle beam irradiating area by irradiating a workpiece with a charge particle beam in a reactant gas atmosphere.

The present invention also relates to a charged particle beam processing method for supplying a mixed gas resulting from mixing a most suitable etching reactant processing gas when layers of workpieces different in composing material are etched.

As a method of mixing a reactive processing gas and also controlling the mixture ratio of a gas to be supplied to a workpiece, there are methods of controlling the mixture ratio by changing a flow rate by means of a mass flow, of controlling the mixture ratio by using a pressure ratio in a buffer chamber after storing a reactive processing gas in the buffer chamber once, and of controlling the mixture ratio by blowing different kings of gases Onto a workpiece through a plurality of nozzles while controlling the flow rate of each gas by means of a flow rate regulating valve.

With respect to a charged particle beam processing apparatus for irradiating a workpiece with a charged particle beam in a reactive processing gas atmosphere to conduct local reactant processing in a charged particle beam irradiation area, the apparatus comprising a beam source for producing charged particle beams such as ion beams and electron beams, a focusing optical system, a stage, a secondary particle detector, an electron gun, a reactive processing gas supply means and a controller for driving them, it may be developed into an invention by providing the reactive gas supply means with a means for mixing a plurality of reactive processing gases and supplying a mixed gas with a different gas mixture ratio.

In the method of subjecting a multilayered device to microsurgery by mixing a reactive processing gas for etching and another for depositing an insulation layer (or a conductor as occasion demands) by CVD according to the present invention, the fact that the reaction velocity of etching and CVD varies with the ion beam incident angle is utilized so as to control the reactive processing gas mixture ratio, so that while an etched hole is formed, an insulation layer (or a conductor as occasion demands) is selectively formable on only the side wall of the etched hole.

In the method of etching a multilayer formed of different materials by mixing a plurality of etching gases, etching may be conducted continuously as it is unnecessary to switch the reactive processing gas when the material of a workpiece changes as etching proceeds. Etching time can thus be shortened.

In the method of controlling the mixture ratio of the plurality of reactive processing gases, that is, controlling the mixture ratio by means of the mass flow, the mass flow is used to control the flow rate of each reactive processing gas and the reactive gases with their flow rates thus controlled are mixed and blown by nozzles onto the workpiece. In this way, the mixture ratio is made controllable In the method of controlling the mixture ratio by means of the buffer chamber, the reactant gas is stored once so as to control the mixture ratio depending on the pressure ratio of one reactant gas to another in the buffer chamber.

In the method of using the plurality of nozzles for blowing reactant gases onto the workpiece, control of the flow rate of each reactant gas is based on the pressure in the buffer chamber and the conductance of the flow rate regulating valve. The reactant gas is then blown from each nozzle onto the workpiece and the reactant gases are mixed on the periphery of the workpiece to control the mixture ratio.

Referring to the accompanying drawings, a plurality of embodiments of the present invention will subsequently be described.

Figure 22:
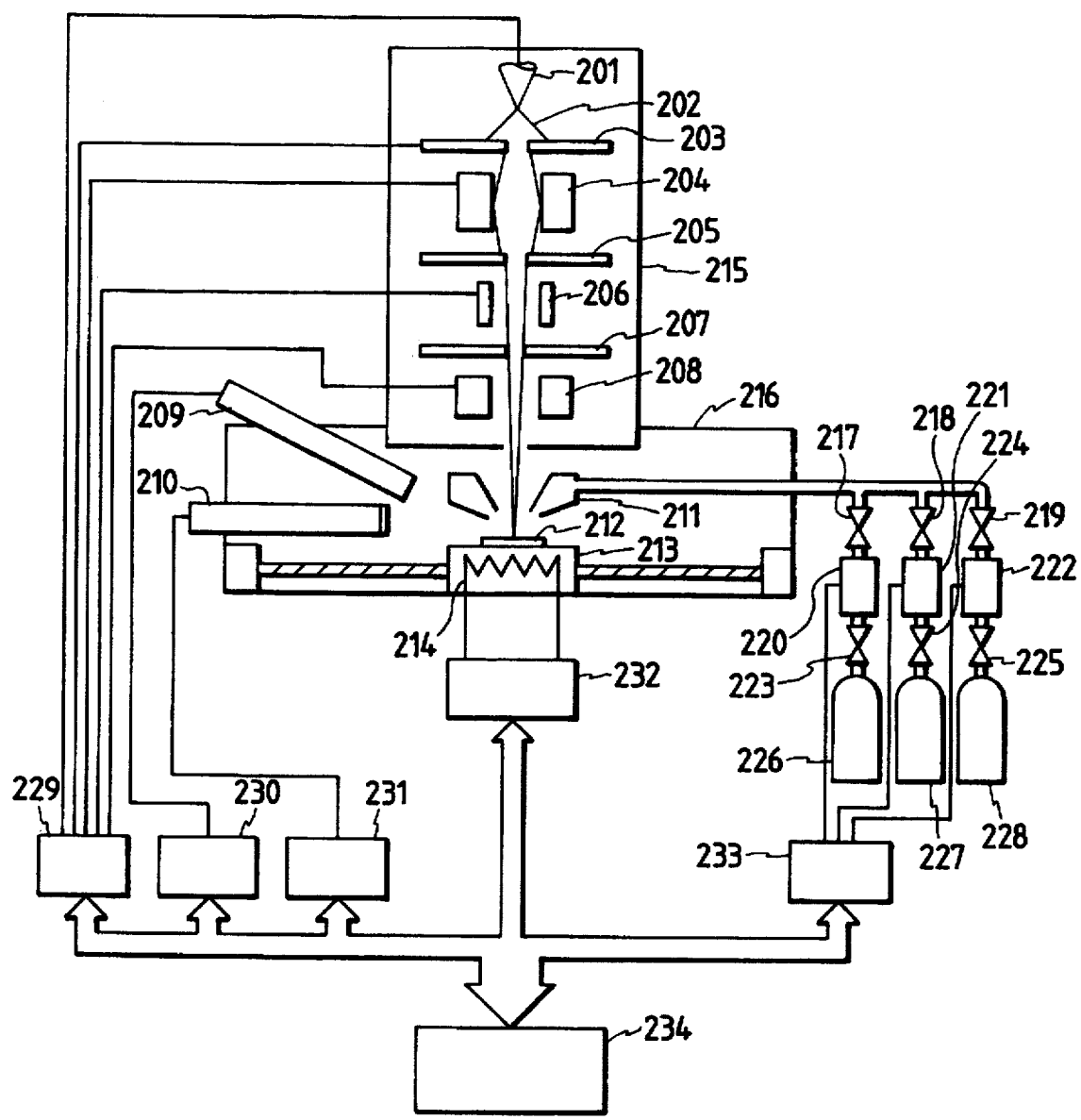
FIG. 22 is an overall block diagram illustrating a processing method and apparatus embodying the present invention.

FIG. 22 is an overall exemplary block diagram illustrating a charged particle beam processing method and apparatus embodying the present invention.

Although ion beams or electron beams are usable as charged particle beams for etching, a focused ion beam is employed as an representative example in this case.

In an ion beam (hereinafter called 'IB') chamber 215 is, as shown in FIG. 22, a focused ion beam optical system comprising a lead-in electrode 203 for leading in ion beams 202 from an ion source 201, a focusing lens 204 for focussing the ion beams 202 thus led in, an aperture 205, a blanking electrode 206 for making and breaking the ion beams 202, an aperture 207 for simultaneous use as a mask for blanking, and a deflecting electrode 208 for deflecting the ion beam, the focused ion beam optical system being controlled by a ion beam controller 229.

In the bottom of the IB chamber 215, there is also provided a through-hole for letting pass the ion beam 202 and preventing a reactant gas from flowing into the IB chamber 215.

A main chamber 216 accommodates a stage 213 for mounting a sample 212 as a workpiece, a nozzle 211 for blowing the reactant gas onto the sample 212, a secondary particle detector 210 for irradiating the ion beam 202 and detecting secondary particles emitted from the sample 212, and an electron gun 209 for neutralizing the positive charge of the ion beam accumulated on the surface of the sample 212. The provision of the electric gun 209 may be omitted when electron beams instead of the ion beams 202 are used as charged particle beams.

The stage 213 incorporates a heater 214 for heating the sample 212, the heater being coupled to a temperature controller 232. Gas cylinders 226, 227, 228 are coupled to the nozzle 211 via valves 217, 218, 219, mass flows 220, 221, 222 and valves 223, 224, 225. The flow rate of the reactant gas is controlled by a mass flow controller 233. The quantity of electrons to be supplied from the electron gun 209 is rendered controllable by an electron gun controller 230 in order to prevent the charge-up of the sample. The secondary particle detector 210 is used to make a secondary particle image obtainable by means of a secondary particle deflecting controller 231 and also make the condition of the etching face of the sample directly observable. These controllers are connected to a computer 234, so that every element is interlocked for operation.

Figure 23:
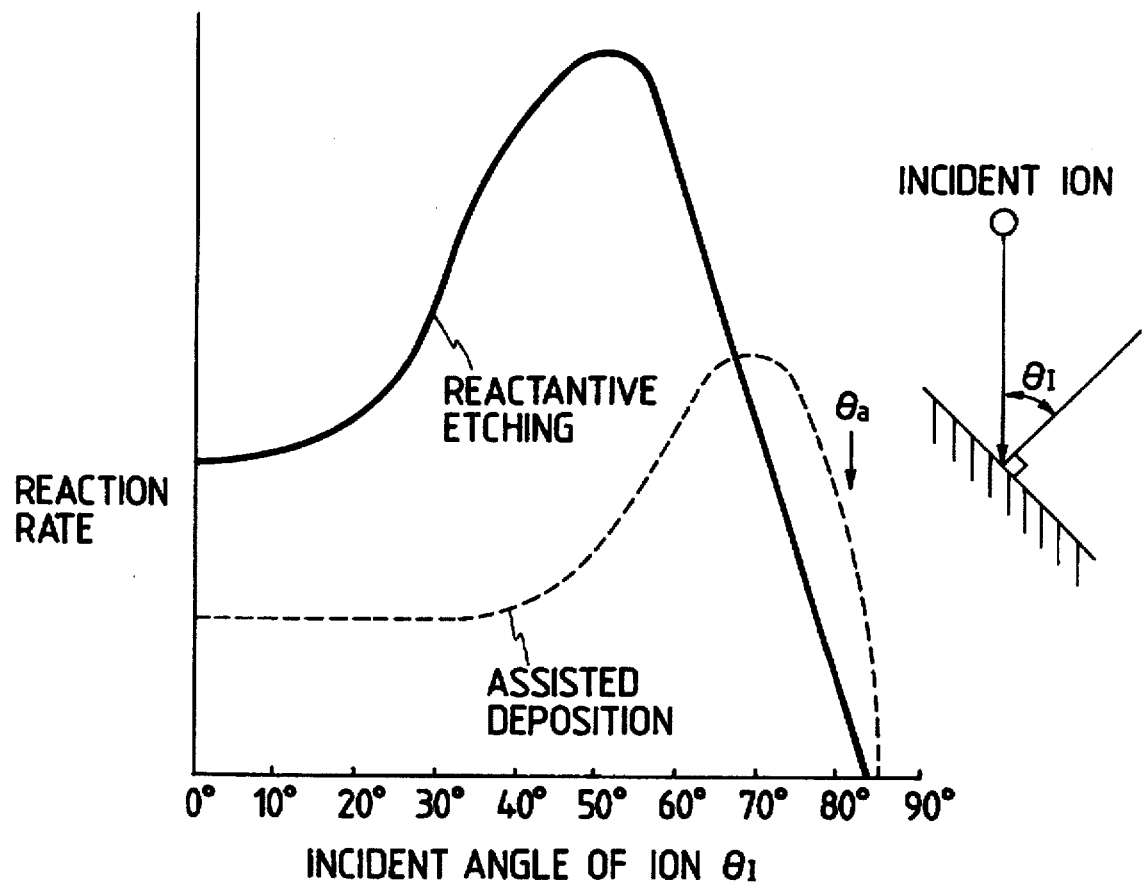
FIG. 23 is a graph illustrating the principle of the processing method wherein etching and deposition progress in parallel according to the present invention.

Referring to FIGS. 23, 24, a description will be given of the principle of a method for conducting reactant type etching and assisted deposition (hereinafter simply called 'deposition') simultaneously in the same chamber.

First, the relation between a reactant type etching rate at an ion incident angle of $\Theta_1$ and deposition velocity is shown in FIG. 23. The reactant type etching reaches its peak at an ion incident angle of about 50° and the velocity sharply drops at incident angles greater than that. On the contrary, the deposition velocity reaches its peak at an ion incident angle of about 70°. As there develops a difference in reaction velocity between etching and deposition depending on the ion incident angle, reactant type etching mainly progresses on the bottom etching side, whereas deposition main progresses in the recessed side wall portion produced by the etching if the difference in reaction velocity therebetween is utilized after the reactive etching gas and the deposition gas are mixed. Consequently, while etching is conducted, layer formation is effected on the side wall of the etched hole by controlling the mixture ratio of both gases.

Figure 24A:
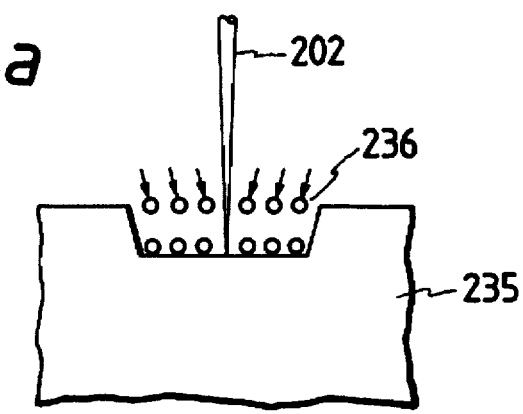
FIGS. 24a–24c are diagrams illustrating the principle of microsurgery wherein etching and deposition progress in parallel.
Figure 24B:
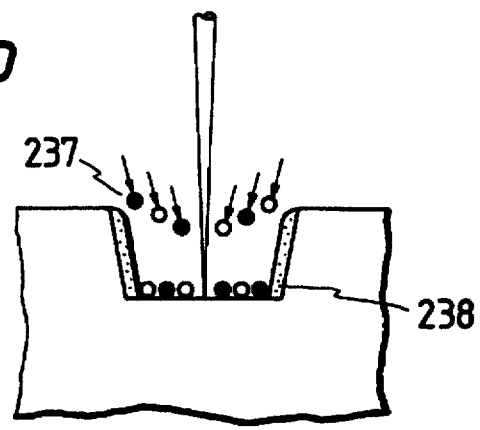
Figure 24C:
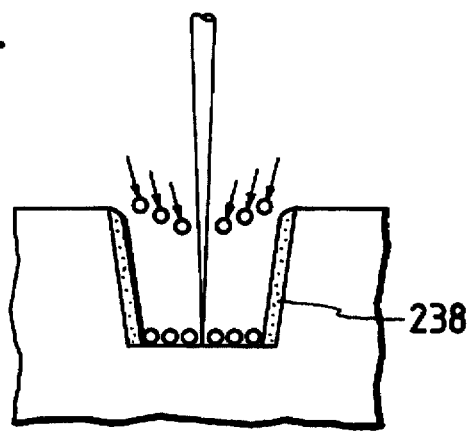

Referring to FIGS. 24a-24c, actual process steps will subsequently be described. As shown in FIG. 24a, while a reactive etching gas 236 corresponding to a workpiece 235 is being blown onto the workpiece 235, it is irradiated with an ion beam 202. At this time, since the tilt angle of the side wall of an etched hole is determined by the scanning velocity of the ion beam 202, the ion beam 202 is controlled in such a manner that the deposition as referred to in FIG. 23 is conducted at a higher velocity angle As shown in FIG. 24b, further, with a mixture ratio of deposition and reactive etching gases 237, 236 being controlled, these gases are mixed and blown to make etching progress while a deposition layer 238 due to decomposition resulting from the deposition gas 237 is formed on the side wall of an etched hole.

As shown in FIG. 24c, the supply of the deposition gas 237 is suspended after etching has been made up to a desired depth and then the bottom of the etched hole is etched, whereby the deposition layer 238 is formed on only the side wall.

Referring to FIGS. $25a_1-25e_2$ and 26, a description will subsequently be given of an example of a control process at the time a multilayered device is processed using an apparatus embodying the present invention and the operation of each part.

As the principal part shown in FIGS. $25a_1-25e_2$ is similar to what is shown in FIG. 22, designations of parts excluding some of them will be omitted as in the case of FIGS. $28a_1-28b_1$.

As shown in FIGS. $25a_1-25e_2$, an LSI forming a multilayered wired structure is used as a sample with Al wiring as a wired conductor layer and $SiO_2$ as an insulation layer, these layers being alternately laminated.

The air in the main chamber 216 with the sample 212 set thereon is discharged by a vacuum exhauster (not shown) to provide a vacuum therein. Then the sample 212 is irradiated with the ion beam 202 and simultaneously electrons are supplied by the electron gun 209. The secondary particle deflector 210 is subsequently used to detect secondary ions produced from the sample 212 and a scanning ion microscope image (hereinafter called 'SIM image') is obtained for observation. The stage 213 is moved to set an etching position and an etching area of the sample 212. The valves 217, 223 are then opened and while the mass flow 220 is used to control the flow rate, the $SiO_2$ reactive etching gas stored in the gas cylinder 226 is blown through the nozzle 211 onto the sample 212 to conduct chemical reactant type etching. As the reactive etching gas for etching $SiO_2$ of the sample, fluorine gases ($CF_4$, $CHF_3$, $C_3F_8$, $XeF_2$, etc.) are primarily preferred. With $XeF_2$ used by way of example, this case will be described. Scanning with the ion beam 202 is made to set the tilt angle of the side wall of an etched area at ea where the etching rate is higher than the deposition velocity.

Subsequently as shown in FIG. $25b_2$, the valves 218, 224 are opened when a hole is etched to a certain depth and while the mass flow 221 is used to control the flow rate of $Si(OC_2H_5)_4$ as the CVD gas for depositing an insulation layer ($SiO_2$), $Si(OC_2H_5)_4$ is mixed with $XeF_2$ and the mixture is blown through the nozzle 211 onto the sample 212. Etching progresses on the bottom face of the etched hole, whereas deposition is conducted on the side wall to form an insulation layer 239.

As shown in FIGS. $25c_1$, $25c_2$, an Al reactive etching gas is mixed with another processing gas and the mixture is supplied to an Al-wired layer. In this case, chlorine gases ($Cl_2$, $CCl_4$, $BCl_4$, $SiCl_4$, etc.) are suitable for the Al reactive etching gas. With $Cl_2$ used by way of example, this case will be described. The valves 219, 225 are opened and while the mass flow 222 is used to control the flow rate of $Cl_2$, which is mixed with other two gases and the mixture is blown through the nozzle 211 onto the sample 212. While the Al-wired layer in the etching area and the insulation layer formed by deposition on the etching bottom face are etched, the insulation layer 239 can be formed by deposition on the side wall. After the termination of wired layer etching is detected with the aid of a SIM image and the etching rate obtained beforehand through experiments, the valves 219, 225 are closed so as to stop the supply of $Cl_2$.

Figure 26:
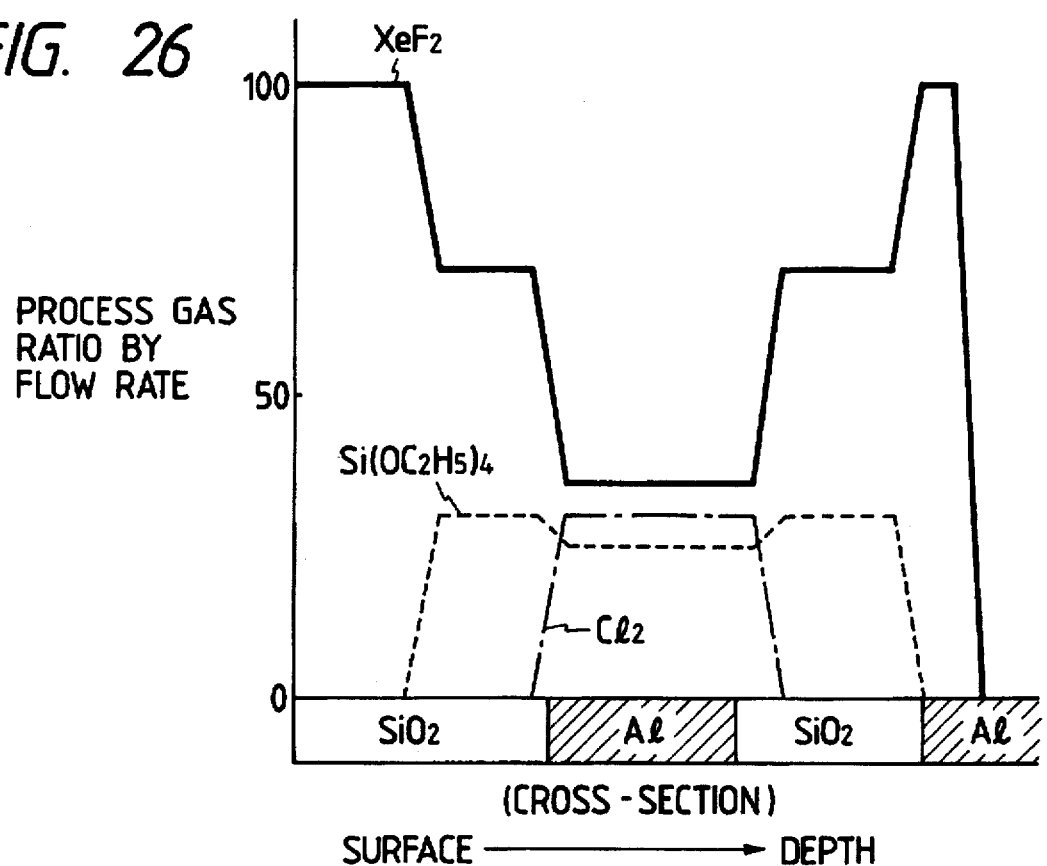
FIG. 26 is a diagram illustrating a process gas ratio corresponding to the material of the semiconductor element subjected to microsurgery.

As shown in FIGS. $25e_1$, $25e_2$, moreover, $SiO_2$ is increasingly etched and the supply of $Si(OC_2H_5)_4$ is stopped at a point of time lower wiring is exposed. Only $XeF_2$ is used to expose completely the surface of the lower wiring at the final stage lest the insulation layer is left thereon. The mixture ratio of these gases is controlled as shown in FIG. 26 to conduct etching in order for the insulation layer to be formed on the side wall of the etched hole. The horizontal axis of FIG. 26 indicates material in the direction of etching depth as viewed from the surface of the sample and the vertical axis a gas mixture composition ratio.

Figure 25F:
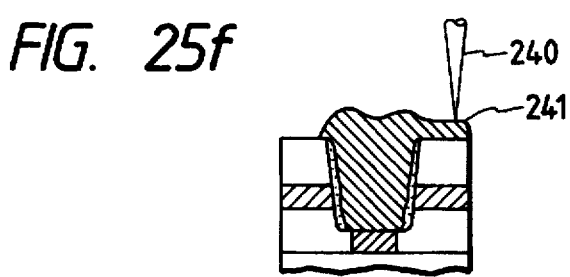
FIGS. 25$a_1$–25$f$ are diagrams illustrating microsurgery for a semiconductor element using the apparatus and method embodying the present invention.

Then another apparatus is used as shown in FIG. 25f for irradiating a laser beam 240 in a CVD gas atmosphere through a known laser CVD method to form CVD wiring 241, whereby the CVD wiring 241 can be led out of the lower wiring layer without shortcircuiting the upper wiring layer.

Instead of forming the insulation layer on the side wall of the etched hole, the CVD gas that can cause a conductor to be deposited may be used to form a conductive metal deposition layer. The method of forming such a deposition layer is similar to what has been described in the embodiment above.

Figure 27:
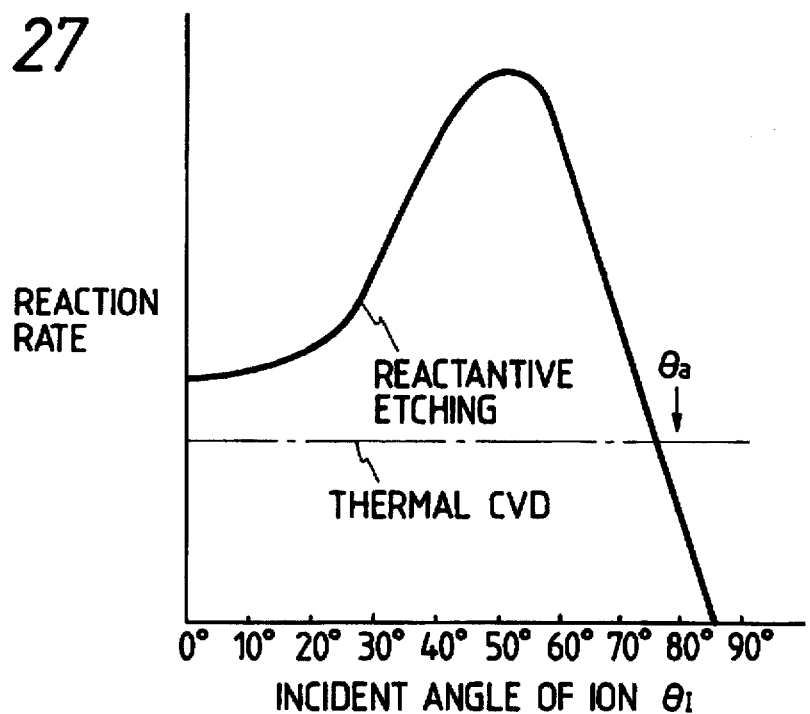
FIG. 27 is a graph illustrating the principle of another processing method wherein etching and deposition progress in parallel according to the present invention.
Figure 29:
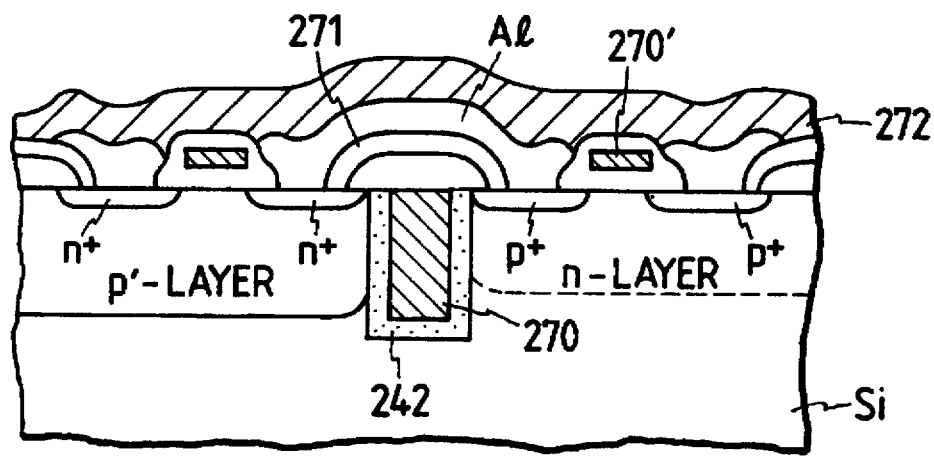
FIG. 29 is a sectional view of CMOS circuit.

Although the assisted deposition method has been employed as a deposition layer method in the embodiment above, thermal CVD may be used as one of the alternatives for forming device separating grooves for preventing a quasi bipolar transistor operation called a CMOS circuit latchup as described in reference to FIGS. 27-29.

FIG. 27 shows the relation between an ion incident angle and reaction velocity. As described in the embodiment above, the thermal CVD always ensures constant reaction velocity since no ion incident angle is relied on, though the reaction velocity varies with the ion incident angle in reactant type etching. The thermal CVD is allowed to effect etching while forming a deposition layer on the side wall by selecting an angle $\Theta a$ at which the reaction velocity is increased from among tilt angles of the side wall recessed by etching and therefore it is superior to the reactant type etching.

With each gas supply system and its cross section as shown in FIGS. $28a_1$–$28b_2$ as an enlarged view of the principal part of the apparatus shown in FIG. 22, the gas supply system is used for first heating an Si substrate up to about 300° C. by means of the heater 214 incorporated with the stage 313. While $XeF_2$ as an Si etching gas is then blown onto the Si substrate, the reactant type etching is locally conducted in the ion beam 202 irradiating area. Simultaneously, $SiH_4+O_2$, for instance, as the CVD gas for depositing an $SiO_2$ layer is mixed with $XeF_2$ before being blown. The $SiH_4+O_2$ mixed gas is thermally decomposed with the $SiO_2$ layer 242 deposited and this accelerates reactant type etching on the bottom face of the etched hole. As a result, no $SiO_2$ layer is formed; however, the $SiO_2$ layer 242 is formed on the side wall. After etching is effected up to a desired depth, the etching gas supply is suspended, whereas only the CVD gas is used to form the $SiO_2$ layer 242 on the bottom face of the etched hole. Subsequently as shown in FIG. 29, device separation is made possible by forming the CMOS circuit through the known process.

With the use of the two methods embodying the embodiments above, a trench capacitor groove can be formed likewise by making use of the formation of the device separation groove of FIG. 29. In other words, as shown in FIG. $28b_2$, the recess of the sample with the surface of the etched recess obtained by etching through the final process step is buried with a conductor such as a poly-Si 270 by CVD. The recess is made one of the electrodes and with the $SiO_2$ layer 242 as a dielectric, the substrate side is made the other electrode (in this case, a poly-Si construction indicated by 270'). The trench capacitor is thus materialized.

Incidentally, 271 in FIG. 29 designates a thermal oxide layer and 272 an SiN layer.

This example refers to a case where a plurality of etching gases corresponding to different materials are mixed so that a sample with the different materials thus laminated is efficiently subjected to sequential etching. Referring to FIGS. $30$–$32c_2$, a description will subsequently be given of the example above.

Figure 30:
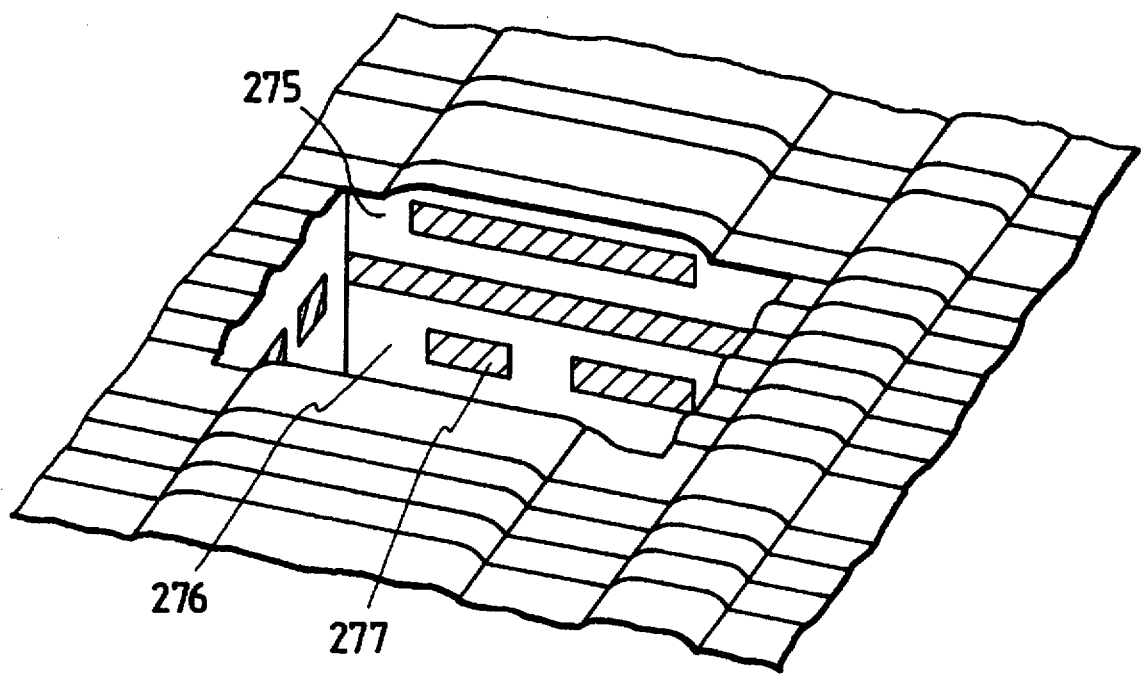
FIG. 30 is a sectional observation view of the semiconductor element.

When SEM or the like is used to observe the section of a semiconductor device for fail analysis of LSI, the front side of the section to be observed will have to be largely etched as shown in FIG. 30. In FIG. 30, numerals 275, 276 and 277 designate an etching area, an insulation layer and a conductor area, respectively. FIGS. $31a_1$–$31c_2$ illustrate a case where a conventional etching method is employed for comparison.

As shown in FIG. $31b_1$, while $XeF_2$ as a fluorine gas is blown, local reactant type etching is conducted in the ion beam 202 irradiation area to subject the uppermost $SiO_2$ layer 247 to chemical reactant type etching. When Al wiring 244 is exposed as etching of the $SiO_2$ layer progresses, etching is almost nearly repressed as $XeF_2$ and Al are slow to react and the Al wiring 244 remains unprocessed, whereas only the $SiO_2$ layer 247 in the neighborhood is selectively etched. As a result, $XeF_2$ shown in FIG. $31b_1$ is discharged once as shown in FIG. $31b_2$ and while $Cl_2$ in the Cl group as an Al reactive etching gas is blown, the Al wiring 244 is etched. When the surface of the $SiO_2$ layer 247 is exposed as the Al wiring 244 is etched, however, the etching rate is slowed. Consequently, $Cl_2$ is discharged once and $XeF_2$ is introduced so as to etch the $SiO_2$ layer 247. This operation is repeated so that etching is made up to a desired depth as shown in FIG. $31c_2$. In the conventional reactant type etching method like this, the etching gas is to be replaced frequently when layers of different materials such as Al and $SiO_2$ are complicatedly laminated and the time required for the whole etching process to be performed tends to lengthen. Moreover, there develops a difference in level as shown in FIG. $31b_2$ as far as the etched profile of the $SiO_2$ layer 247 is concerned. This means additional etching time is required to the extent that the $SiO_2$ layer 247 has such a difference in level.

The foregoing is a description of the comparative example. Referring now to FIGS. $32a_2$–$31c_2$, a description will be given of a case where a processing method embodying the present invention is employed in contrast to the conventional one.

While the mixture ratio of $XeF_2$ to $Cl_2$ is so controlled that the etching rate of $SiO_2$ layer 247 and Al wiring 244–246 conforms to each other so as to blow the mixed gas, as shown in FIG. $32a_2$, the ion beam 202 is irradiated to conduct reactant type etching. As shown in FIGS. $32b_2$, $32c_2$, the etching is thereby caused to continue always at the same etching depth without any difference in level as far as the $SiO_2$ layer is concerned. As it is possible to conduct etching continuously without replacement of the etching gas, the whole etching time is made reducible.

When reactive etching gases corresponding to respective different materials are mixed, the difference in reactive etching rate between the materials tends to increase. If the etching gas mixture ratio fails to make the etching rate identical, the etching rate may be regulated by mixing the reactive etching gas contributing to a higher etching rate with a buffer gas (e.g., $Cl_2+O_2$).

Figure 33:
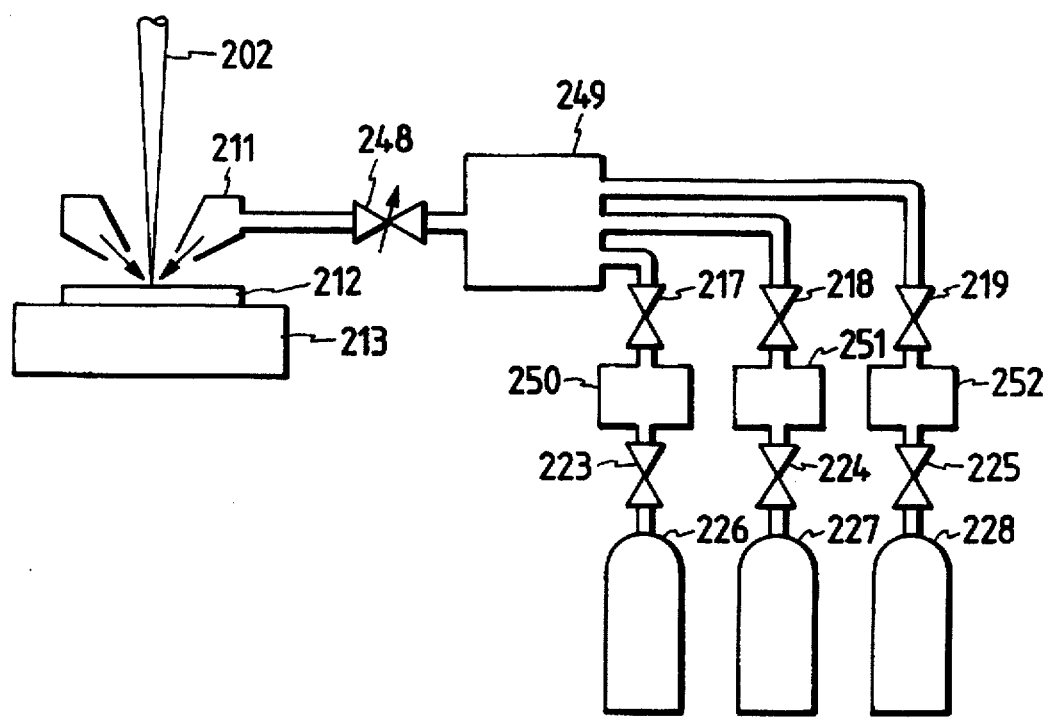
FIGS. 33–35 are diagrams of the principal parts of respective apparatus using different process gas ratios embodying the present invention.

An example shown in FIG. 33 refers to a modification wherein a plurality of reactive gases are mixed and supplied and FIG. 33 is a block diagram illustrating the principal part of an apparatus for As shown in FIG. 33, valves 223, 224, 225 are respectively coupled to the leading ends of gas cylinders 226, 227, 228 containing reactive processing gases and valves 217, 218, 219 are provided via sub-buffer chambers 250, 251, 252. The nozzle 211 is provided via a buffer chamber 249 and a flow rate regulating valve 248 and used to blow the reactive processing gas onto the sample 212. In this case, the method of changing the processing gas mixture ratio comprises the steps of introducing the reactive processing gas in each sub-chamber up to a desired pressure level, and opening the valves 217, 218, 219 to introduce the reactive processing gas from the sub-buffer chambers 250, 251, 252 into the buffer chamber 249 so as to exert control by means of the pressure ratio. Then the flow rate of the processing gas thus mixed in accordance with the conductance of the flow rate regulating valve 248 is set at a desired value and the processing gas is blown from the nozzle 211 onto the sample 212. When the reactive processing gas mixture ratio is changed, the buffer chamber 249 and the sub-buffer chambers 250, 251, 252 are made vacuous through exhaust tubes (not shown). By controlling the pressure of the reactive processing gas to be introduced into the sub-chamber again, the mixture ratio is made controllable.

Figure 34:
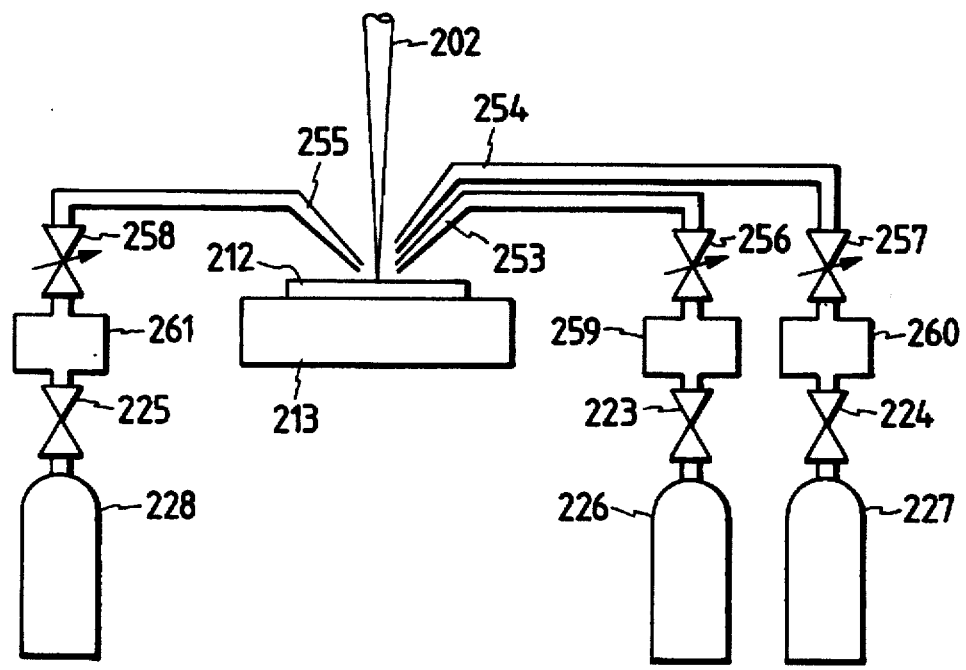

FIG. 34 illustrates another example of gas mixture embodying the present invention. Referring to the accompanying drawings, the gas mixture will subsequently be described.

As shown in FIG. 34, the gas cylinders 226, 227, 278 are coupled via the valves 223, 224, 225 to the buffer chambers 259, 260, 261 and also coupled via the flow rate regulating valves 256, 257, 258 to the respective nozzles 253, 254, 255. In this case, the reactive processing gas is blown from the nozzle onto the sample 212 at the desired flow rate regulated by the pressure in the buffer chamber and the conductance of the flow rate regulating valve. The reactive processing gases are mixed on the sample 212. By regulating the pressure in each buffer chamber and the conductance of the flow rate regulating valve, the mixture ratio of the processing gases is made controllable.

Figure 35:
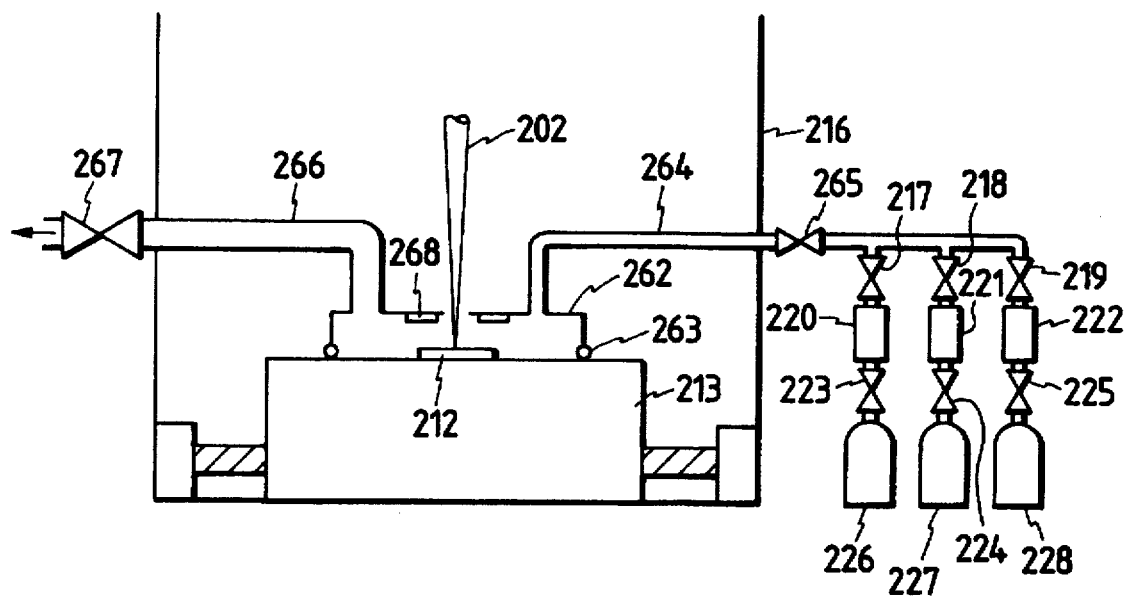

FIG. 35 shows another example of gas mixture embodying the present invention and it will be described as follows.

A sample chamber 262 having a small capacity is provided over the stage 213 to expose the sample 212 to a mixed reactive processing gas. The plurality of etching gas cylinders 226, 227, 228 are coupled via the valves 223, 224, 225, the mass flows 220, 221, 222 and the valves 217, 218, 219, 265 to the sample chamber 262. The sample chamber 262 is coupled via an exhaust tube 266 and a valve 267 to an exhauster (not shown) so that the pressures of the processing gases introduced into the sample chamber 262 are made constant and that the quantity and discharge velocity of processing gas supply are balanced by means of the valve 267. In order to obtain a secondary particle image for use in observing the sample at the time of positioning the etching position, a secondary particle detector 268 is provided in the sample chamber 262. As the sample 212 moves together with the stage 213, a sliding seal 263 such as an O-ring is used for coupling the sample chamber 262 and the stage 213. In this way, sealing the processing gas in the sample chamber 262 together with moving the stage 213 is made possible. The processing gases are controlled by the respective mass flows in terms of flow rates and introduced into the sample chamber 262 before being mixed. The reactive processing gases thus introduced are discharged via the exhaust tube 266 with the discharge amount regulated by the valve 267. The supply amount of the reactive processing gas is thus kept constant. Control of the mixture ratio of the reactive processing gases can readily be accomplished by changing the flow rate of the reactive processing gas by means of each mass flow.

In the embodiments shown in FIGS. 33–35 respectively, means other than what is used for mixing the plurality of reactive processing gases and supplying them while controlling the mixture ratio of them are similar to those shown in FIG. 22 and the description of them has been omitted accordingly According to these embodiments of the present invention, a desired layer such as an insulation layer can be formed selectively on the side wall of the etched recess simultaneously when the multilayered device is etched with charged particle beam irradiation and the plurality of reactive processing gases in combination. Preventive reliability of wiring disconnection is thus improvable. Moreover, the time required for the whole etching process may be shortened to ensure efficient etching.

By mixing reactive processing gases conforming (corresponding) to materials even when the multilayered device composed of different materials, the etching process can be conducted continuously without gas replacement. The trouble of replacing the gas is thus obviated, whereas the time required for the etching process may be shortened to ensure efficient etching.

As described previously, the conventional local etching apparatus using a charged particle beam causes a fierce spontaneous reaction if using $Cl_2$ as an etching gas when Al is etched, thus causing side etching; on the other hand, it causes almost nearly no local reaction if using $SiCl_4$ or $Bcl_3$ as the etching gas. There exists no etching gas singly exhibiting a suitable reaction. A conventional single etching gas tends to cause a reaction too fierce or otherwise cause no reaction and this makes it impossible to subject some materials to local etching with a suitable energy beam. The present invention provides an improved energy beam local etching method capable of simply controlling the reactivity in such a way that, in place of the conventional charged particle beam, an ion beam is employed in order to implement the present invention in the form of an apparatus proposed herein.

According to the present invention, an etching gas that causes a spontaneous reaction too fierce to be used as an etching gas and another etching gas slow in reactivity are mixed and the mixed gas is used for effecting local etching using an energy beam such as a charged particle beam and the like. At this time, the mixture ratio of those gases is set at a given value under control to accomplish the object of the present invention.

Moreover, an etching gas causing a spontaneous reaction too fierce to be employed and a CVD gas are mixed for use in conducting energy beam local etching and the mixture ratio of these gases is set at a given value under control to accomplish the object of the present invention. In this case, the CVD gas represents what is used at the time a desired material is deposited in accordance with known chemical vapor-phase deposition.

Figure 37:
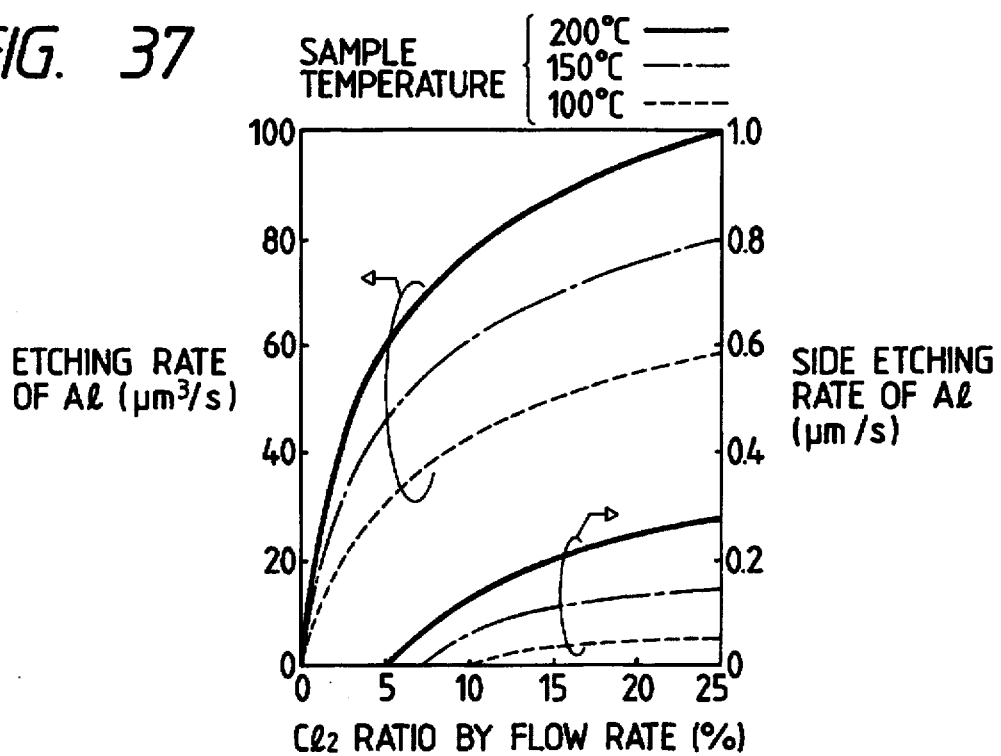
FIG. 37 is a graph illustrating functions of means for accomplishing the present invention.

The present inventors have made various experiments on workpieces and mixed gas compositions and acquired the following knowledge. More specifically, they tried to subject Al material as a workpiece to local etching in a Ga ion beam irradiating area with the use of a mixed gas of $Cl_2$ and $SiCl_4$ as an etching gas while the $Cl_2$ mixture ratio and the sample temperature T are varied. The result is shown in FIG. 37. When the sample temperature is constant, the acceleration increases as the $Cl_2$ mixture ratio increases and the side etching arises at over a certain mixture ratio and gradually increases. As is obvious from this drawing, the side etching is seen to arise at $Cl_2$ 5% when the sample temperature is at 200° C.

When the mixture ratio is constant, moreover, not only the etching rate but also the side etching quantity increases as the sample temperature increases. As a result, it will be understood that the reactivity is made controllable by controlling the $Cl_2$ mixture ratio and the sample temperature. For instance, high-velocity etching can be conducted in an area where the $Cl_2$ mixture ratio is low and where no side etching arises. In addition, the side etching is intentionally caused to arise in an area where the $Cl_2$ mixture ratio is high and where the sample temperature is high.

Figure 38:
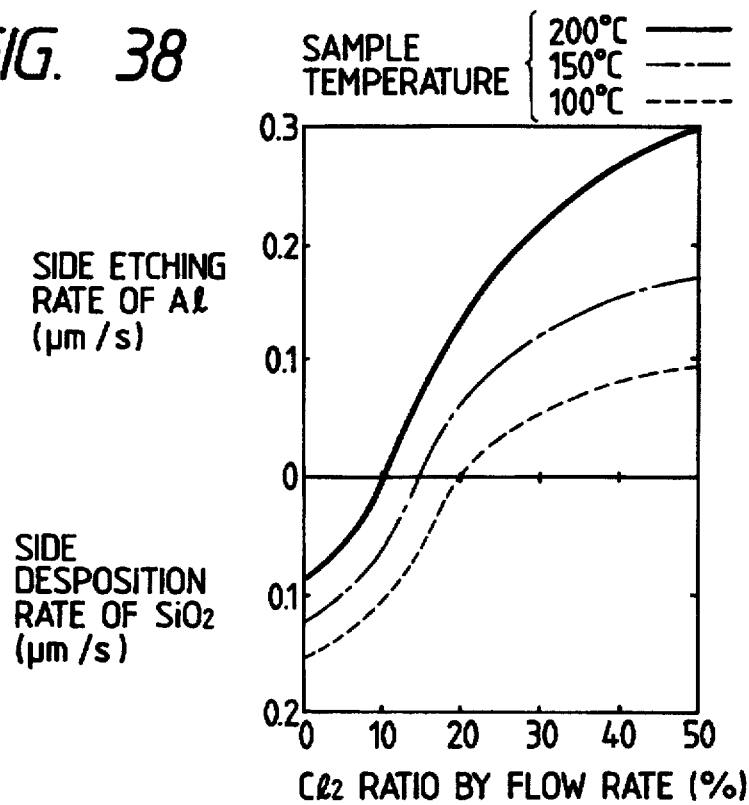
FIG. 38 is a graph illustrating functions of means for accomplishing the present invention.

FIG. 38 shows the results obtained from experiments in which a mixed gas of $Cl_2$ and $Si(OC_2H_5)_4$ is employed as the processing gas against the workpiece material Al; the $Cl_2$ mixture ratio and the sample temperature are made variable; and local etching is attempted in a Ga ion beam irradiation area. As the $Cl_2$ mixture ratio increases, the accumulation of $SiO_2$ resulting from the decomposition of $Si(OC_2H_5)_4$ is shifted to the side etching by $Cl_2$ on the side wall of the etched hole with a certain mixture ratio as a boundary. At a sample temperature of 200° C., for instance, the accumulation of $SiO_2$ at over 10% of $Cl_2$ is seen to shift to the side etching. Moreover, the side etching quantity increases as the sample temperature increases. By controlling the $Cl_2$ mixture ratio and the sample temperature, it will be understood that the accumulation of $SiO_2$ on the side wall of the etched hole and the quantity of side etching, that is, the reactivity is readily controllable.

Even though the material to be etched is changed from Al to Si, GaAs, for instance, the same result may be obtained from experiments likewise. Moreover, the energy beams for use are not limited what is available from Ga ions but laser beams in addition to known ion beams, electron beams may be used.

Referring to the accompanying drawings, embodiments of the present invention will be described. Although ion beams are used as energy beams in the following embodiments, electron beams may be used likewise.

Figure 36A:
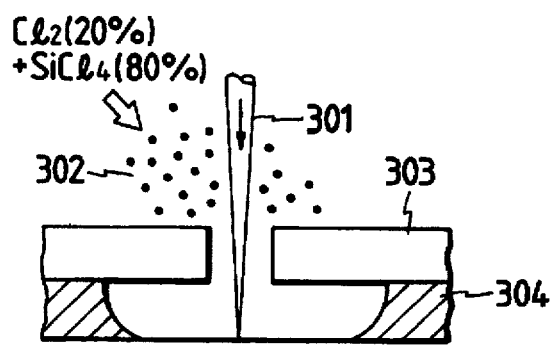
FIGS. 36a, 36b are diagrams illustrating the principle of the embodiment of the present invention.
Figure 36B:
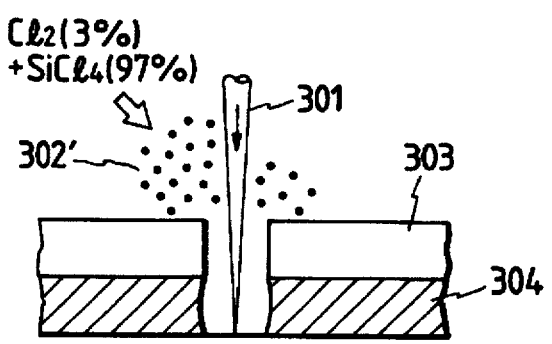

Referring to FIGS. 36a, 36b, a description will be given of a case where a mixture of a spontaneous etching gas and another etching gas is employed. As described above in reference to FIG. 37, the reactivity is controllable by the mixture ratio of the spontaneous etching gas and another etching gas and the sample temperature. The example shown in FIG. 36a refers to a case where the ion beam is irradiated in a mixed gas atmosphere 302, 302' of $Cl_2$ and $SiCl_4$ and where an Al layer 304 is etched via an $SiO_2$ insulation layer 303. At this time, the sample temperature is fixed at 200° C. and as shown in FIG. 36a, $Cl_2$ mixture ratio is set at 20%, whereby a specific quantity of side etching (about 0.25 μm/s in this case) intentionally allows setting a side etching quantity in order for no damage such as disconnection to be caused sidewise. If the $Cl_2$ mixture ratio is set at 3% as shown in FIG. 36b, etching may be effected without side etching. As set forth above, such side etching may be avoided with isotropy or anisotropy caused intentionally or otherwise the side etching quantity to be produced may be set by controlling the mixture ratio of $Cl_2$ as the spontaneous etching gas.

Figure 39:
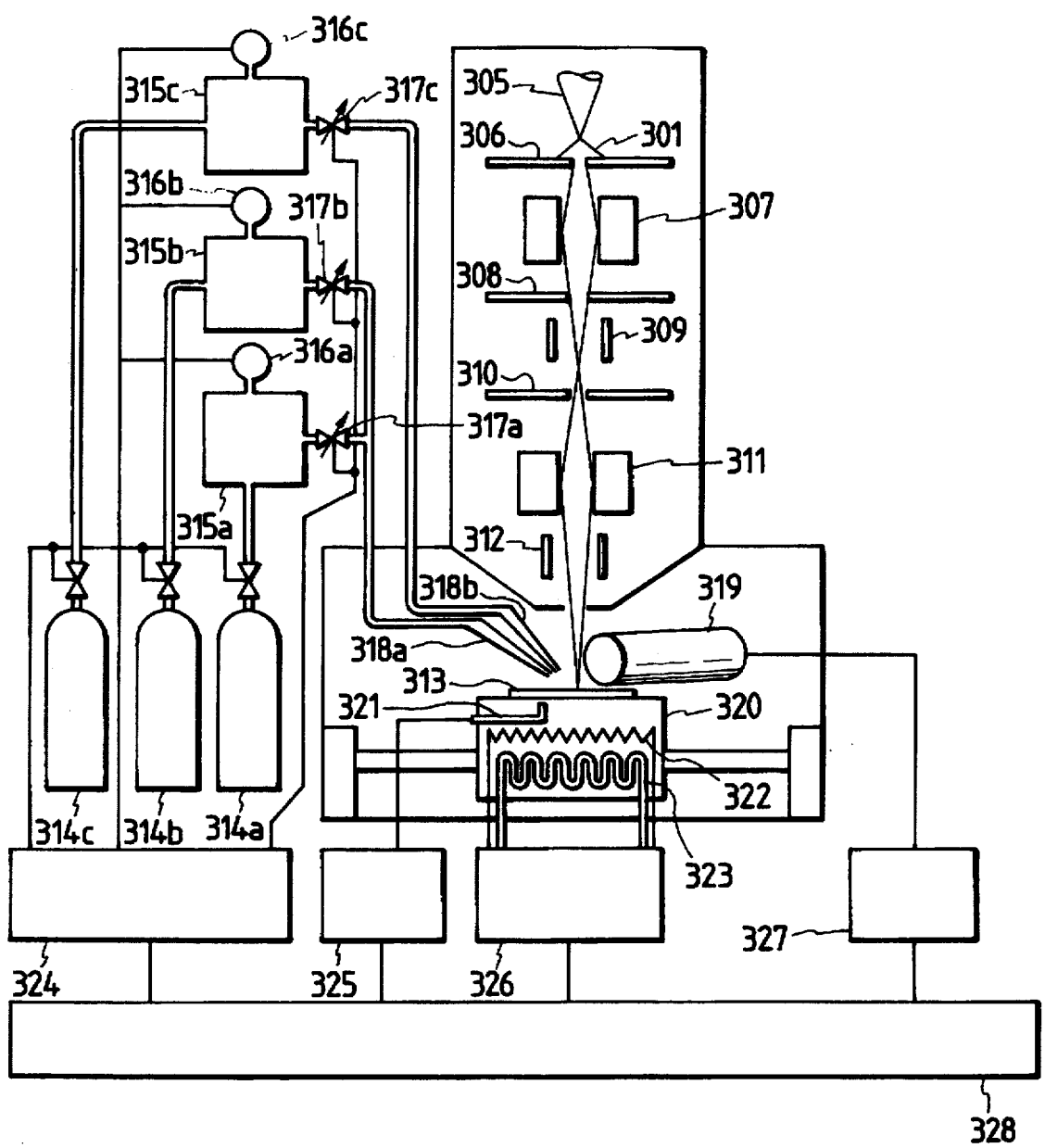
FIG. 39 is a diagram illustrating the construction of a specific apparatus shown in the embodiment of FIG. 36a, etc.

FIG. 39 illustrates the construction of an apparatus embodying the present invention. As shown in FIG. 39, ion beams 301 led by a lead-in electrode 306 from an ion source 305 are focused by a prestage focusing lens 307 and a poststage focusing lens 311 onto a sample 313. At this time, the ion beam current is controlled by the radius of a beam limiting aperture 308. Then the track of the beam is curved by a blanking electrode 309 and the beam is shut off by a blanking aperture 310. However, the on/off state of the beam is thereby controlled. Moreover, the focused ion beam is deflected by a deflecting electrode 312 and a desired area on the sample is irradiated therewith. At the time of Al etching, $Cl_2$ from a gas cylinder 314a and $SiCl_4$ from a gas cylinder 314b are mixed at a set mixture ratio via buffer chambers 315a, 315b and flow rate control valves 317a, 317b and the mixture is supplied to the surface of the sample 313 via a gas nozzle 318a. Although the mixture ratio of the mixed gas then is controlled by the flow rate ratio of the respective gases, the flow rate of the gas is set in accordance with the pressures in the buffer chambers 315a, 315b and the conductance of the flow rate control valves 317a, 317b.

A supply system for an etching gas $XeF_2$ to be used when an $SiO_2$ insulation layer as another etching material is etched comprises a gas cylinder 314c, a buffer chamber 315c, a flow rate control valve 317c and a gas nozzle 318b. Simultaneously when the etching gas is supplied, the sample 313 is irradiated with the focused ion beam to conduct beam local etching. A reaction product detector 319 is then used to detect a product resulting from the reaction and to monitor the etching material and an etching rate. As the reaction product detector 319, use can be made of a mass spectrometer (quadruple mass spectrometer, sector magnetic field mass spectrometer, etc) and a spectrum analyzer (fluorescence detector, photoelectron spectrometer, etc.). The temperature of the sample being etched is monitored by a thermocouple 321 provided in a stage 320 and controlled by a heater 322 and a cooling tube 323.

Referring to FIGS. $40a_1$–$40d_2$, an example of etching method embodying the present invention will subsequently be described. As shown therein, this example refers to a case where a lower wired layer 332 held between two wired layers 331, 333 of LSI is cut. If the lower wired layer 332 is simply processed, there is fear for the upper and the lower wiring to shortcircuit defectively as reaction products and sputtered atoms flying out during that process may cling to the side wall of the etched hole again. Consequently, use is made of the fact that the reactivity during Al etching, that is, the side etching quantity is controllable. In this case, the ratio of isotropy to anisotropy (relative magnitude) is equal to the side etching quantity (large or small).

First, as shown in FIG. $40a_1$, an XeF$_2$ gas 329 is used to etch an SiO$_2$ protective layer 330 and as shown in FIG. $40b_1$, a mixed gas 302 of Cl$_2$ (20%) and SiCl$_4$ (80%) is used to cause side etching fit for roughly preventing disconnection and to etch the upper wired layer 331. Subsequently, as shown in FIG. $40c_1$, the XeF$_2$ gas 328 is used to etch the layer-to-layer insulation layer 332 and as shown in FIG. $40d_1$, a mixed gas 302 of Cl$_2$ (3%) and SiCl$_4$ (97%) is used to cut the lower wired layer 333 while the side etching is prevented. Through the process steps above, the upper and the lower wiring are prevented from shortcircuiting due to the side etching of the upper wired layer 331 and by minimizing the damage of the upper and lower wiring, etching can be conducted.

A description will subsequently be given of another embodiment of the present invention wherein a mixture of a spontaneous etching gas and a CVD gas is employed. As referred to the function described in FIG. 38, the reactivity is rendered controllable by using the mixture ratio of the spontaneous etching gas and the CVD gas and the sample temperature. The apparatus for implementing this embodiment is entirely similar to what has been described above and the CVD gas Si(OC$_2$H$_5$)$_4$ for an SiO$_2$ deposition layer instead of an etching gas SiCl$_4$ is employed therein.

When the spontaneous etching gas Cl$_2$ and the CVD gas Si(OC$_2$H$_5$)$_4$ are mixed and used to perform the same cutting operation as what has been referred to in FIGS. $40a_1$–$40d_2$, the SiO$_2$ layer may be piled on the cut side of the lower wired layer 333 at the steps taken in FIGS. $40d_1$, $40d_2$ according to the present invention. As a result, the cutting reliability can be improved.

Figure 41:
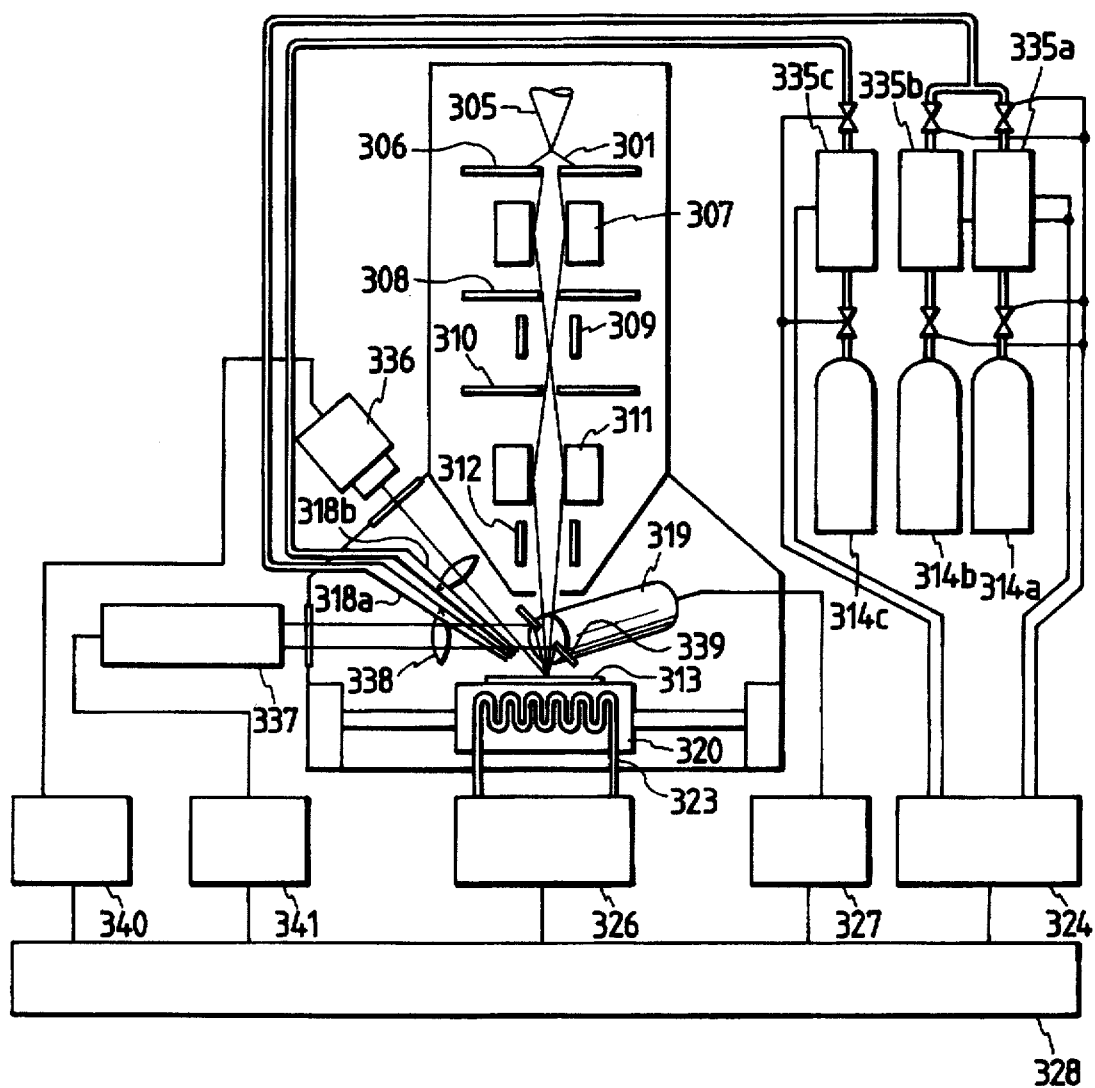
FIG. 41 is a diagram illustrating another apparatus embodying the present invention.

A description will be given of still another embodiment of the present invention wherein a mixed gas comprising a spontaneous etching gas and another etching gas is employed for etching and wherein metal layer CVD is continuously formed. As referred to in the embodiment of FIGS. $36a_1$, $36b_1$, the reactivity is made controllable by means of the mixture ratio of the spontaneous etching gas and the CVD gas and the sample temperature during the etching process. FIG. 41 illustrates the construction of an apparatus embodying the present invention. Cl$_2$ from the gas cylinder 314a and SiCl$_4$ from the gas cylinder 314b are mixed with the flow rates (i.e., mixture ratio) set respectively by mass flow controllers 335a, 335b at the time of Al etching and the mixture is supplied via the gas nozzle 318a to the surface of the sample 313. Moreover, there are provided the gas cylinder 314c, a mask low controller 335c and the gas nozzle 318a constituting a system for supplying CVD gas W(CO)$_6$ at the time of forming a metal W deposition layer. As the W(CO)$_6$ is a subliming crystal, the whole CVD gas supply system is monitored by an infrared-ray thermometer 336 while the heater is used for etching or in terms of the sample temperature during the formation of a deposition layer and also controlled by a laser irradiation heater unit and the cooling tube 323. In this case, the laser irradiation heater unit includes a laser oscillator 337, an objective lens 338 and a reflecting mirror 339. The components other than the gas supply system and the sample temperature control system are similar in function to those of the apparatus illustrated in the embodiment of FIGS. 36a, 36b.

Referring to FIG. $42a_1$, an example of the local etching method embodying the present invention will subsequently be described. As shown in FIG. $42a_1$, this is a case where a signal detecting pad is led into a metal layer CVD from the lower wired layer 333 held between two wired layers 331, 333 of LSI. If a contact hole is simply formed in the lower wired layer 333 through the upper wired layer 331 to lead in a metal layer W, the metal deposition layer will cause the upper and lower wiring to shortcircuit, thus making no signal obtainable. Consequently, as shown in FIG. $42a_1$, the SiO$_2$ protective layer 330 is first etched by ion beam 301 sputtering and then a mixed gas 302 of Cl$_2$ (20%) and SiCl$_4$ (80%) is used to cause suitable side etching to etch the upper wired layer 331. Subsequently as shown in FIG. $42c_1$, the layer-to-layer insulation layer 332 is etched by sputtering to expose the lower wired layer 333. As shown in FIG. $42d_2$, W(CO)$_6$ CVD gas is used to form a signal detecting pad 343 by leading the metal layer W from the lower wired layer 333.

As set forth above, the upper wiring side etching is utilized to provide a deposition layer for preventing the shortcircuiting of the metal layer W to ensure that the signal detecting pad is formed from the lower wired layer 333 simply and definitely. Although the optimum sample temperature varies with timing; namely, at the time the upper wired layer 331 is etched and the W deposition layer is formed, the sample temperature is made controllable by quickly turning on/off the heating laser with the use of the apparatus according to the present invention.

According to the present invention described with reference to FIG. 36a, as the mixture ratio of the gases and the temperature of the etching area are controllable as desired by using the mixed gas of the etching gas causing spontaneous reaction and other processing gases when the energy beam is irradiated in the etching gas atmosphere, the energy beam local etching reactivity regarding materials for which suitable beam local etching has been impossible to provide, since a single etching gas causes a reaction too fierce or causes almost nearly no reaction, can effectively be controlled.

What is claimed is:

1. A processing method using a focused energy beam for locally etching a workpiece, comprising the steps of:
   introducing mixed reactant gases comprising a reactive etching gas and a CVD gas into a processing chamber containing said workpiece;
   irradiating said focused ion energy beam onto a local portion of said workpiece; and,
   forming an etching hole by etch-reacting said reactive etching gas on said workpiece at said local portion with said irradiated focused energy beam while depositing a film on a sidewall of said etching hole by decomposing said CVD gas with said irradiated focused ion beam, wherein the rate of said depositing is larger than the rate of said etch-reacting.

2. A processing method using a focused ion beam as claimed in claim 1, wherein said film deposited on said sidewall of said etching hole exhibits etch-reacting of said reactive etching gas on said sidewall of said etching hole.

3. A processing method using a focused ion beam as claimed in claim 1, wherein said workpiece is a multilayer device composed of an insulating layer and a metal wiring layer, and wherein each gas of said mixed reactant gases reacts with one of said layers constituting said workpiece to cause etching of or deposition on said layer in the focused beam irradiation area.

4. A processing method using a focused ion beam for etching a multilayer device having a metal wiring layer located under an insulating layer, said method comprising the steps of:

introducing mixed reactant gases comprising a first reactive etching gas for said insulating layer and a second reactive etching gas for said second metal wiring layer into a processing chamber containing said multilayer device, said first reactive etching gas being a fluorine gas and said second reactive etching gas being a chlorine gas;

irradiating said focused ion beam onto a local portion of a surface of said multilayer device in the presence of said mixed reactant gases; and, forming an etching hole by etch-reacting said mixed reactant gases on said local portion of said multilayer sample with said irradiated focused ion beam without changing between the introduction of said first reactive etching gas and said second reactive etching gas.

5. A processing method using a focused ion beam for etching a multi-layer device having a metal wiring layer located under an insulating layer as claimed in claim 4, wherein said mixed reactant gases comprise at least one spontaneous gas and one nonspontaneous gas, and wherein said gases are reactive only at said local portion of said multilayer device where said focused ion beam is irradiated, and wherein by controlling the temperature of said multilayer device and by controlling the mixture ratio of said spontaneous and nonspontaneous etching gas and irradiating said focused ion beam onto said local portion of said multilayer device, the side etching amount at said local portion is controlled.

* * * * *